(12) United States Patent
Hayashi

(10) Patent No.: US 12,032,255 B2
(45) Date of Patent: Jul. 9, 2024

(54) DISPLAY DEVICE

(71) Applicant: Japan Display Inc., Tokyo (JP)

(72) Inventor: Hirotaka Hayashi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/354,158

(22) Filed: Jul. 18, 2023

(65) Prior Publication Data

US 2024/0036419 A1 Feb. 1, 2024

(30) Foreign Application Priority Data

Jul. 28, 2022 (JP) .................................. 2022-120729

(51) Int. Cl.
| | |
|---|---|
| *G02F 1/1362* | (2006.01) |
| *G02F 1/1334* | (2006.01) |
| *G02F 1/1335* | (2006.01) |
| *G02F 1/1343* | (2006.01) |
| *G02F 1/1368* | (2006.01) |
| *H01L 27/12* | (2006.01) |

(52) U.S. Cl.
CPC ...... *G02F 1/136286* (2013.01); *G02F 1/1334* (2013.01); *G02F 1/133512* (2013.01); *G02F 1/134309* (2013.01); *G02F 1/1368* (2013.01); *H01L 27/124* (2013.01)

(58) Field of Classification Search
CPC ............. G02F 1/136286; G02F 1/1334; G02F 1/133512; G02F 1/133707; G02F 1/13394
See application file for complete search history.

(56) References Cited

U.S. PATENT DOCUMENTS

| | | | | |
|---|---|---|---|---|
| 4,778,258 | A | * 10/1988 | Parks | ...................... H01L 27/12 438/30 |
| 2007/0097282 | A1 | * 5/2007 | Hashiguchi | ....... G02F 1/133555 349/43 |
| 2016/0315133 | A1 | 10/2016 | Sato | |
| 2018/0090551 | A1 | 3/2018 | Sato | |
| 2019/0157369 | A1 | 5/2019 | Sato | |
| 2020/0166796 | A1 | * 5/2020 | Okuyama | ............. G02F 1/1334 |
| 2020/0235184 | A1 | 7/2020 | Sato | |
| 2022/0004052 | A1 | 1/2022 | Ohue | |

FOREIGN PATENT DOCUMENTS

| | | |
|---|---|---|
| JP | 2016-207486 A | 12/2016 |
| JP | 2020-160254 A | 10/2020 |

* cited by examiner

*Primary Examiner* — Jessica M Merlin
(74) *Attorney, Agent, or Firm* — Maier & Maier, PLLC

(57) ABSTRACT

According to an aspect, a display device includes: a first light-transmitting substrate; a second light-transmitting substrate; a liquid crystal layer that is disposed between the first and second light-transmitting substrates; scan lines that are provided to the first light-transmitting substrate and extend along a first direction; signal lines that extend in a second direction; a switching element; a pixel electrode provided in an area surrounded by the scan lines and the signal lines; an undercoat film provided so as to cover a principal surface of the first light-transmitting substrate; and a gate insulating film between a gate electrode and a semiconductor layer of the switching element. The gate insulating film has a first opening in an area overlapping the pixel electrode. The pixel electrode is directly stacked on the undercoat film in the area overlapping the first opening.

8 Claims, 21 Drawing Sheets

FIG.13
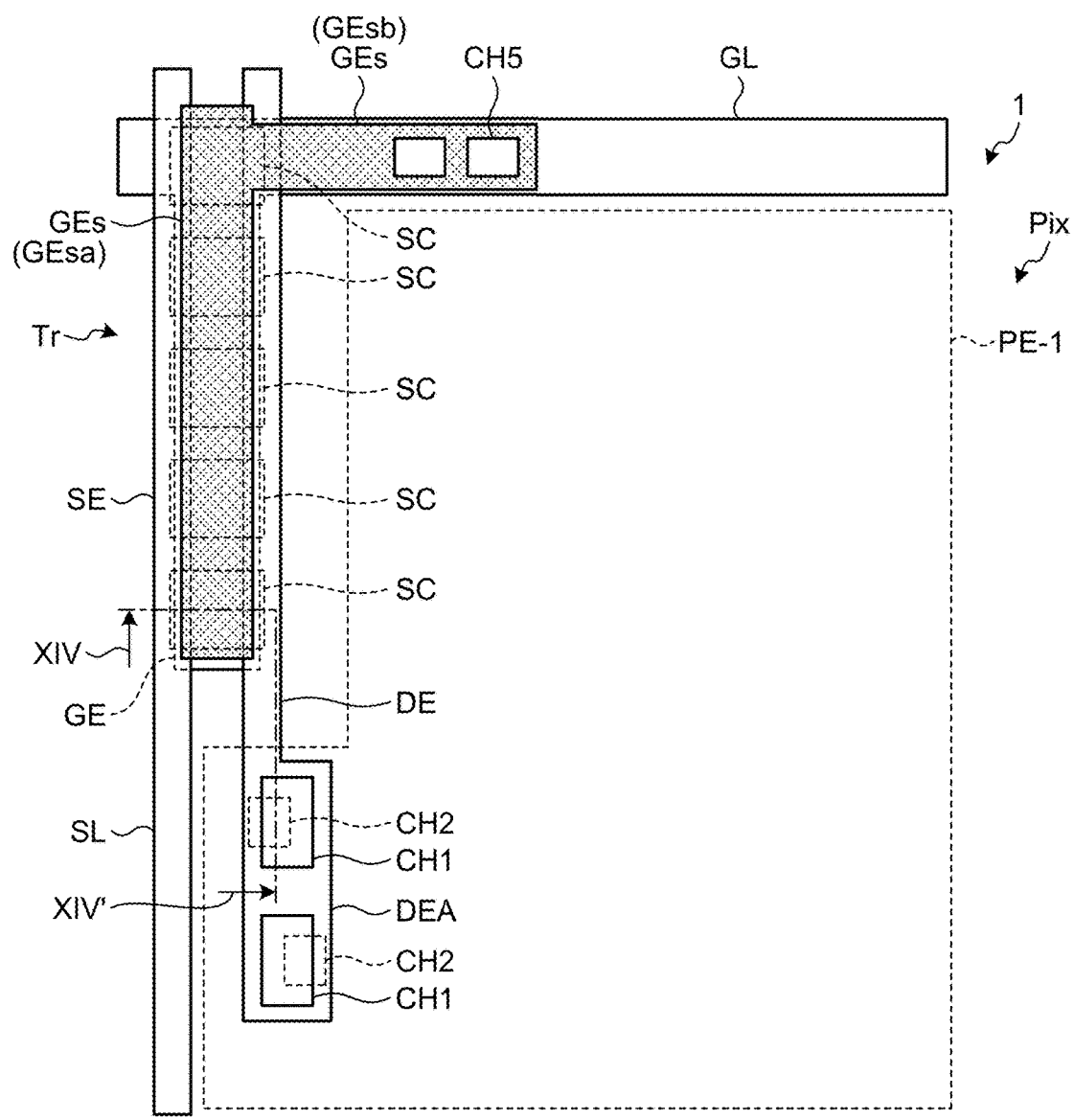
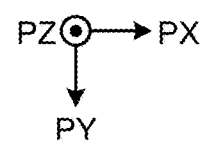

DISPLAY DEVICE

CROSS-REFERENCE TO RELATED APPLICATION

This application claims the benefit of priority from Japanese Patent Application No. 2022-120729 filed on Jul. 28, 2022, the entire contents of which are incorporated herein by reference.

BACKGROUND

1. Technical Field

What is disclosed herein relates to a display device.

2. Description of the Related Art

Japanese Patent Application Laid-open Publication No. 2016-207486 (JP-A-2016-207486) and Japanese Patent Application Laid-open Publication No. 2020-160254 (JP-A-2020-160254) each describe what is called a transparent display that is configured such that a viewer on one surface side of a display panel can view a background on the other surface side opposite to the one surface side. In JP-A-2016-207486, the transparent display is configured by a spontaneously luminescent organic electroluminescent (EL) display device. The transparent display is not limited to the self-luminous organic EL display device. In JP-A-2020-160254, the transparent display is configured by a liquid crystal display using polymer-dispersed liquid crystals.

In such display devices, the transmittance of light in a display region is required to be improved. For example, in JP-A-2016-207486, an interlayer insulating film and a planarizing film in the display region are removed. However, in the JP-A-2016-207486, an insulating film for forming a gate insulating film and generating holding capacitance is provided in the display region, which requires further improvement in transmittance of light.

SUMMARY

According to an aspect, a display device includes: a first light-transmitting substrate; a second light-transmitting substrate that faces the first light-transmitting substrate; a liquid crystal layer that is disposed between the first light-transmitting substrate and the second light-transmitting substrate and includes polymer-dispersed liquid crystals; scan lines that are provided to the first light-transmitting substrate and extend along a first direction; signal lines that extend in a second direction intersecting the first direction; a switching element coupled to a corresponding one of the scan lines and a corresponding one of the signal lines; a pixel electrode provided in an area surrounded by the scan lines and the signal lines; an undercoat film provided so as to cover a principal surface of the first light-transmitting substrate; and a gate insulating film provided between a gate electrode and a semiconductor layer of the switching element. The gate insulating film has a first opening in an area overlapping the pixel electrode. The pixel electrode is directly stacked on the undercoat film in the area overlapping the first opening of the gate insulating film.

According to an aspect, a display device includes: a first light-transmitting substrate; a second light-transmitting substrate that faces the first light-transmitting substrate; a liquid crystal layer that is disposed between the first light-transmitting substrate and the second light-transmitting substrate and includes polymer-dispersed liquid crystals; a plurality of scan lines that are provided to the first light-transmitting substrate and extend along a first direction; a plurality of signal lines that extend in a second direction intersecting the first direction; a switching element coupled to a corresponding one of the scan lines and a corresponding one of the signal lines; a pixel electrode provided in an area surrounded by the scan lines and the signal lines; and a gate insulating film provided between a gate electrode and a semiconductor layer of the switching element. The gate insulating film has a first opening in an area overlapping the pixel electrode. The pixel electrode is directly stacked on a principal surface of the first light-transmitting substrate in the area overlapping the first opening of the gate insulating film.

BRIEF DESCRIPTION OF THE DRAWINGS

FIG. 13 is a plan view illustrating a configuration example of the switching element illustrated in FIG. 10;

DETAILED DESCRIPTION

Figure 1:
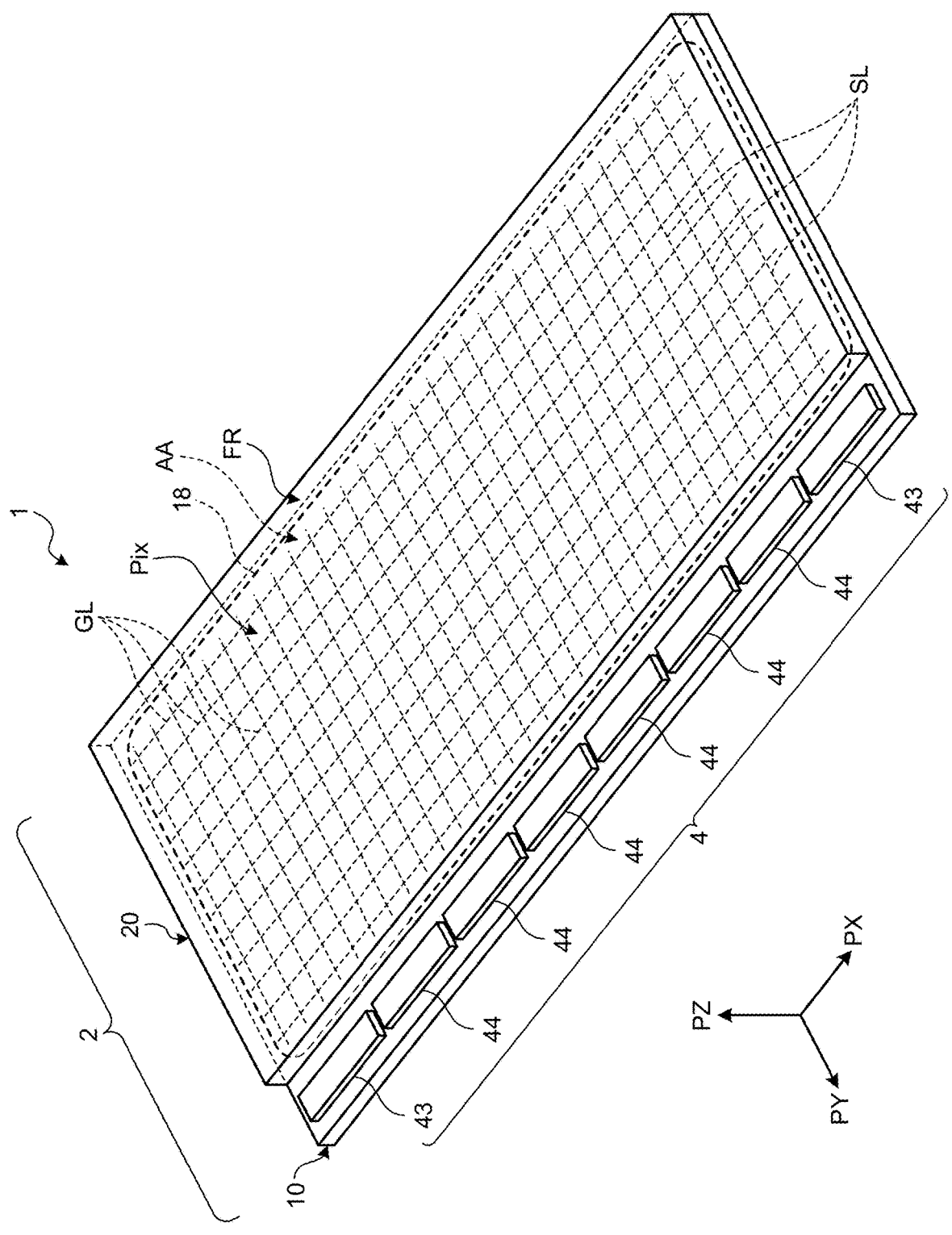
FIG. 1 is a perspective view illustrating an example of a display panel according to an embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings schematically illustrate, for example, widths, thicknesses, and shapes of various parts as compared with actual aspects thereof, in some cases. However, they are merely examples, and interpretation of the present disclosure is not limited thereto. The same element as that illustrated in a drawing that has already been discussed is denoted by the same reference numeral through the present disclosure and the drawings, and detailed description thereof will not be repeated in some cases where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 2:
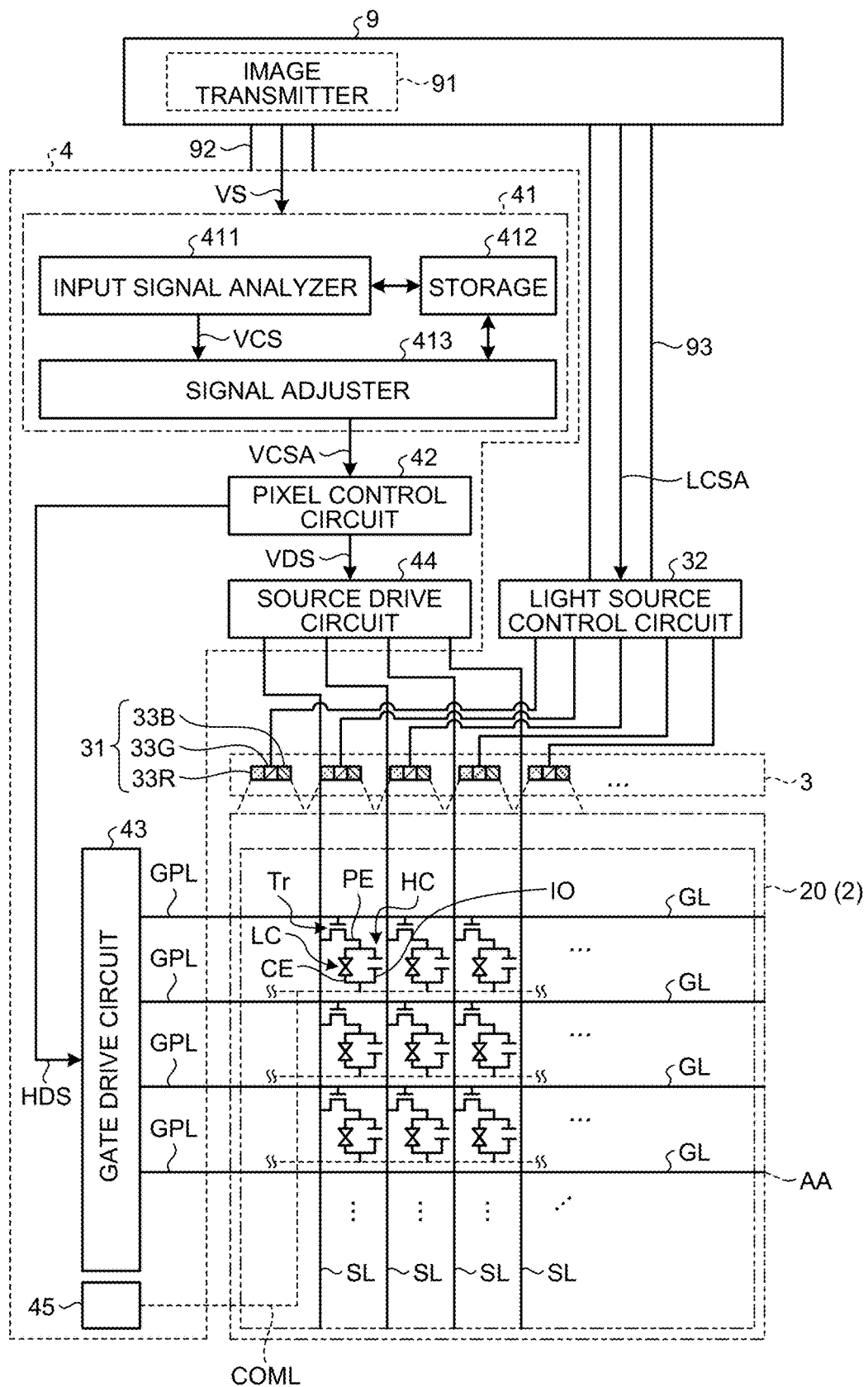
FIG. 2 is a block diagram illustrating a display device according to a first embodiment.
Figure 3:
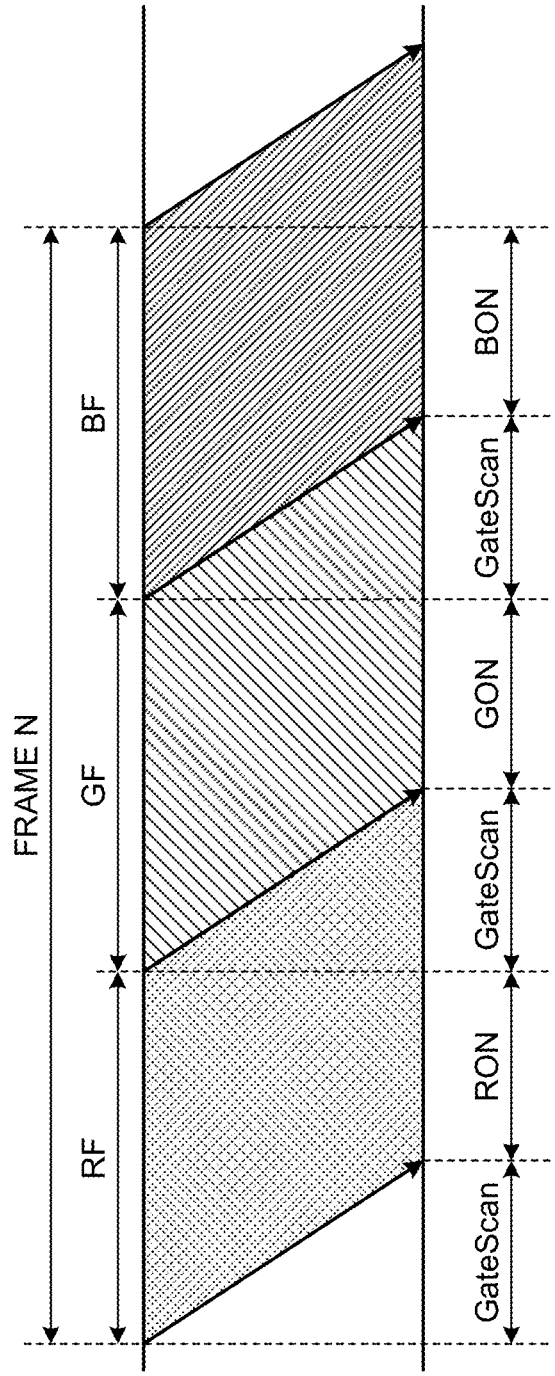
FIG. 3 is a timing diagram explaining timing of light emission by a light source in a field-sequential system of the first embodiment.

FIG. 1 is a perspective view illustrating an example of a display panel according to an embodiment. FIG. 2 is a block diagram illustrating a display device according to a first embodiment. FIG. 3 is a timing diagram explaining timing of light emission by a light source in a field-sequential system of the first embodiment.

As illustrated in FIG. 1, a display device 1 includes a display panel 2, a light source 3 (refer to FIG. 5), and a drive circuit 4. A first direction PX denotes one direction in the plane of the display panel 2. A second direction PY denotes a direction orthogonal to the direction PX. A third direction PZ denotes a direction orthogonal to the PX-PY plane. The term "plan view" refers to the positional relation when viewed in the third direction PZ.

Figure 5:
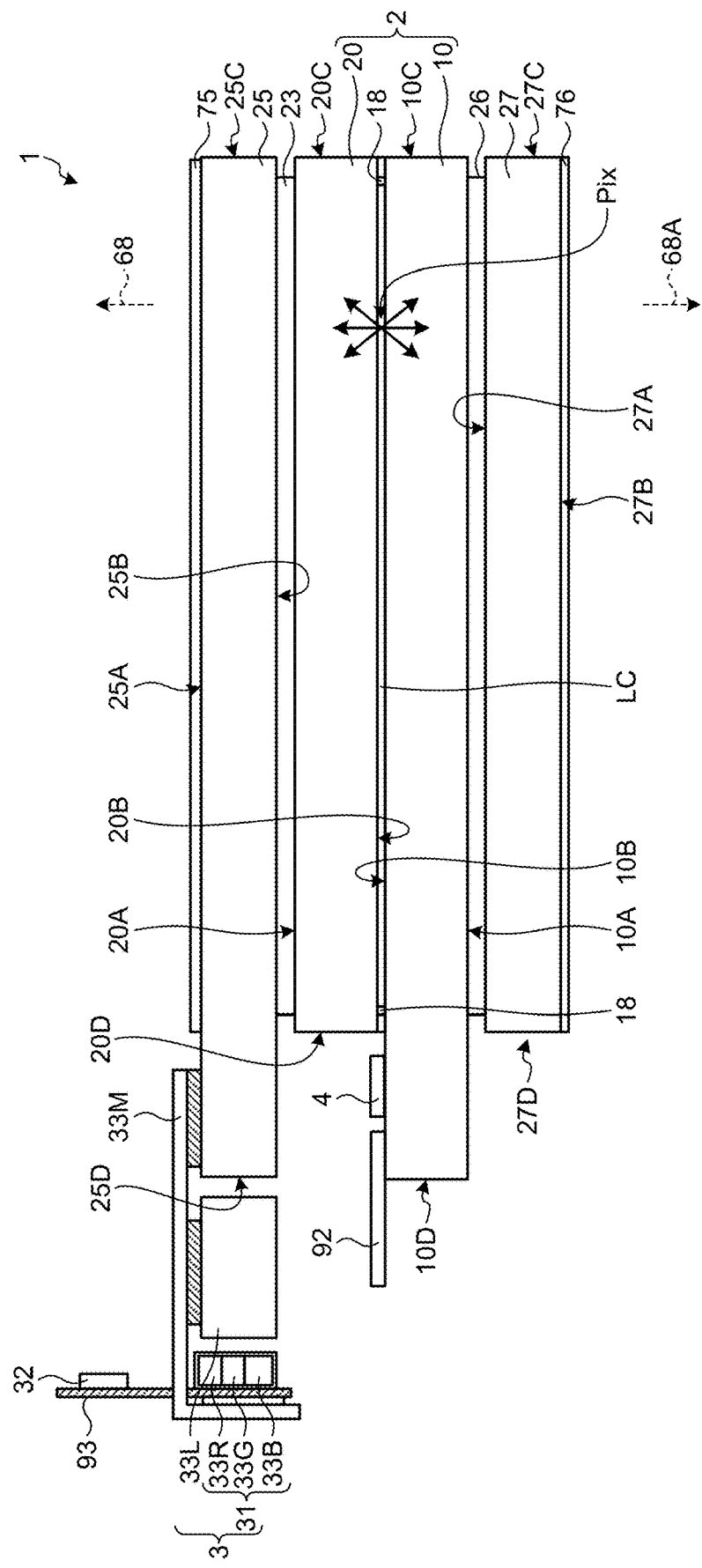
FIG. 5 is a sectional view illustrating an example of a section of the display device.

The display panel 2 includes an array substrate 10, a counter substrate 20, and a liquid crystal layer 50 (refer to FIG. 5). The array substrate 10 serves as a first light-transmitting substrate, and the counter substrate 20 serves as a second light-transmitting substrate. The counter substrate 20 faces a surface of the array substrate 10 in a direction orthogonal thereto (in the third direction PZ illustrated in FIG. 1). In the liquid crystal layer 50 (refer to FIG. 5), polymer-dispersed liquid crystals LC (to be described later) are sealed by the array substrate 10, the counter substrate 20, and a sealing portion 18. The drive circuit 4 includes at least a gate drive circuit 43 and a source drive circuit 44, which will be described later.

As illustrated in FIG. 1, the display panel 2 has an active region AA capable of displaying images and a peripheral region FR outside the active region AA. A plurality of pixels Pix are arranged in a matrix having a row-column configuration in the active region AA. In the present disclosure, a row refers to a pixel row including m pixels Pix arranged in one direction. In addition, a column refers to a pixel column including n pixels Pix arranged in a direction orthogonal to the direction in which the rows extend. The values of m and n are determined depending on a display resolution in the vertical direction and a display resolution in the horizontal direction. A plurality of scan lines GL are arranged corresponding to the rows, and a plurality of signal lines SL are arranged corresponding to the columns.

As illustrated in FIG. 2, the light source 3 includes a plurality of light emitters 31. A light source control circuit 32 is provided on a wiring substrate 93. The wiring substrate 93 is a flexible printed circuit board or a printed circuit board (PCB) substrate. A light source control signal LCSA is transmitted from an image transmitter 91 of an external higher-level controller 9 to the light source control circuit 32. The light source control signal LCSA is a signal including information on light quantities of the light emitters 31 set according to, for example, input gradation values given to the pixels Pix.

As illustrated in FIG. 1, the drive circuit 4 is fixed to the surface of the array substrate 10. As illustrated in FIG. 2, the drive circuit 4 includes a signal processing circuit 41, a pixel control circuit 42, a gate drive circuit 43, a source drive circuit 44, and a common potential drive circuit 45. The array substrate 10 has an area in the PX-PY plane larger than that of the counter substrate 20, and the drive circuit 4 is provided on a projecting portion of the array substrate 10 exposed from the counter substrate 20.

The signal processing circuit 41 receives a first input signal (such as a red-green-blue (RGB) signal) VS from the image transmitter 91 of the external higher-level controller 9 through a flexible printed circuit board 92.

The signal processing circuit 41 includes an input signal analyzer 411, a storage 412, and a signal adjuster 413. The input signal analyzer 411 generates a second input signal VCS based on the externally received first input signal VS.

The second input signal VCS is a signal for determining a gradation value to be given to each of the pixels Pix of the display panel 2 based on the first input signal VS. In other words, the second input signal VCS is a signal including gradation information on the gradation value of each of the pixels Pix.

The signal adjuster 413 generates a third input signal VCSA from the second input signal VCS. The signal adjuster 413 transmits the third input signal VCSA to the pixel control circuit 42.

The pixel control circuit 42 then generates a horizontal drive signal HDS and a vertical drive signal VDS based on the third input signal VCSA. In the present embodiment, since the display device 1 is driven based on the field-sequential system, the horizontal drive signal HDS and the vertical drive signal VDS are generated for each color emittable by the light emitters 31.

The gate drive circuit 43 sequentially selects the scan lines GL of the display panel 2 based on the horizontal drive signal HDS within one vertical scan period. The scan lines GL can be selected in any desired order. The gate drive circuit 43 is electrically coupled to the scan lines GL through second wiring GPL arranged in the peripheral region FR outside the active region AA (refer to FIG. 1).

The source drive circuit 44 supplies gradation signals corresponding to output gradation values of the pixels Pix to the signal lines SL of the display panel 2 based on the vertical drive signal VDS within one horizontal scan period.

In the present embodiment, the display panel 2 is an active-matrix panel. Therefore, the display panel 2 includes the signal (source) lines SL extending in the second direction PY and the scan (gate) lines GL extending in the first direction PX in plan view, and includes switching elements Tr at intersecting portions between the signal lines SL and the scan lines GL.

A thin-film transistor is used as each of the switching elements Tr. A bottom-gate transistor or a top-gate transistor may be used as an example of the thin-film transistor. Although a single-gate thin film transistor is exemplified as the switching element Tr, the switching element Tr may be a double-gate transistor. One of the source electrode and the drain electrode of the switching element Tr is coupled to a corresponding one of the signal lines SL. The gate electrode of the switching element Tr is coupled to a corresponding one of the scan lines GL. The other of the source electrode and the drain electrode is coupled to one end of a capacitor of the polymer-dispersed liquid crystals LC to be described later. The capacitor of the polymer-dispersed liquid crystals LC is coupled at one end thereof to the switching element Tr through a pixel electrode PE, and coupled at the other end thereof to common potential line COML through a common electrode CE. Holding capacitance HC is generated between the pixel electrode PE and a holding capacitance electrode IO electrically coupled to the common potential line COML. The potential of the common potential line COML is supplied from the common potential drive circuit 45.

Each of the light emitters 31 includes a light emitter 33R of a first color (such as red), a light emitter 33G of a second color (such as green), and a light emitter 33B of a third color (such as blue). The light source control circuit 32 controls the light emitter 33R of the first color, the light emitter 33G of the second color, and the light emitter 33B of the third color so as to emit light in a time-division manner based on the light source control signal LCSA. In this manner, the light emitter 33R of the first color, the light emitter 33G of the second color, and the light emitter 33B of the third color are driven based on the field-sequential system.

As illustrated in FIG. 3, in a first sub-frame (first predetermined time) RF, the light emitter 33R of the first color emits light during a first color light emission period RON, and the pixels Pix selected during one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the first color is lit up during the first color light emission period RON.

Then, in a second sub-frame (second predetermined time) GF, the light emitter 33G of the second color emits light during a second color light emission period GON, and the pixels Pix selected during the one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the second color is lit up during the second color light emission period GON.

Furthermore, in a third sub-frame (third predetermined time) BF, the light emitter 33B of the third color emits light during a third color light emission period BON, and the pixels Pix selected during the one vertical scan period GateScan scatter light to perform display. On the entire display panel 2, if the gradation signal corresponding to the output gradation value of each of the pixels Pix is supplied to the above-described signal lines SL for the pixels Pix selected during the one vertical scan period GateScan, only the third color is lit up during the third color light emission period BON.

Since a human eye has limited temporal resolving power and produces an afterimage, an image with a combination of three colors is recognized in a period of one frame (1F). The field-sequential system can eliminate the need for a color filter, and thus can reduce an absorption loss by the color filter. As a result, higher transmittance can be achieved. In the color filter system, one pixel is made up of sub-pixels obtained by dividing each of the pixels Pix into the sub-pixels of the first color, the second color, and the third color. In contrast, in the field-sequential system, the pixel may not be divided into the sub-pixels in such a manner. A fourth sub-frame may be further included to emit light in a fourth color different from any one of the first color, the second color, and the third color.

Figure 4:
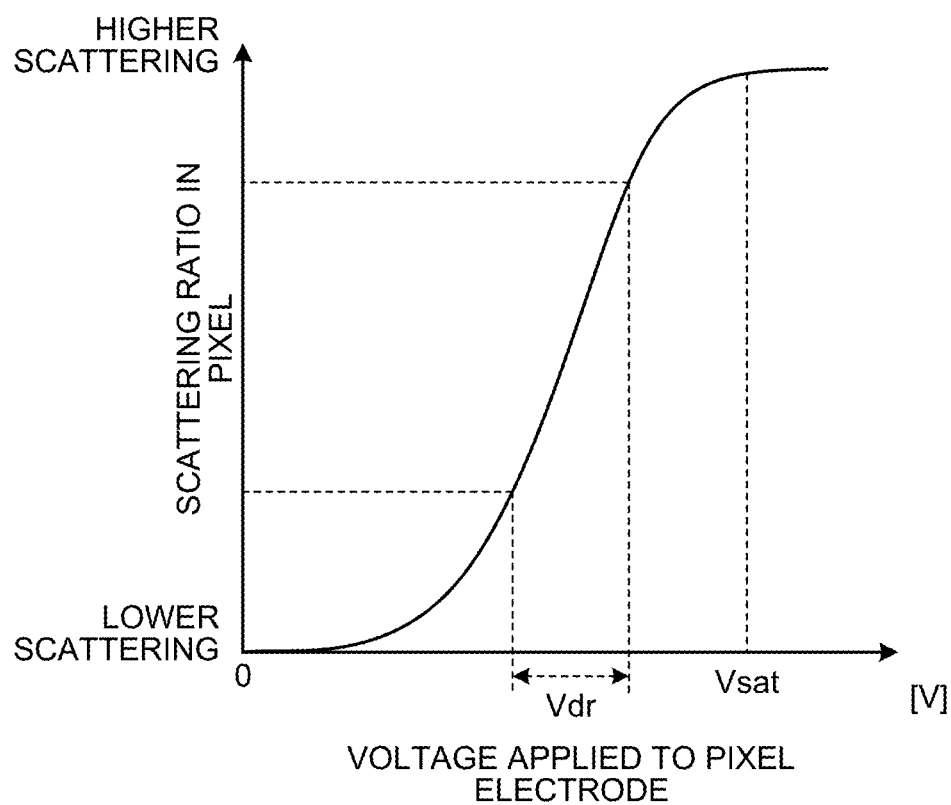
FIG. 4 is an explanatory diagram illustrating a relation between a voltage applied to a pixel electrode and a scattering state of a pixel.
Figure 6:
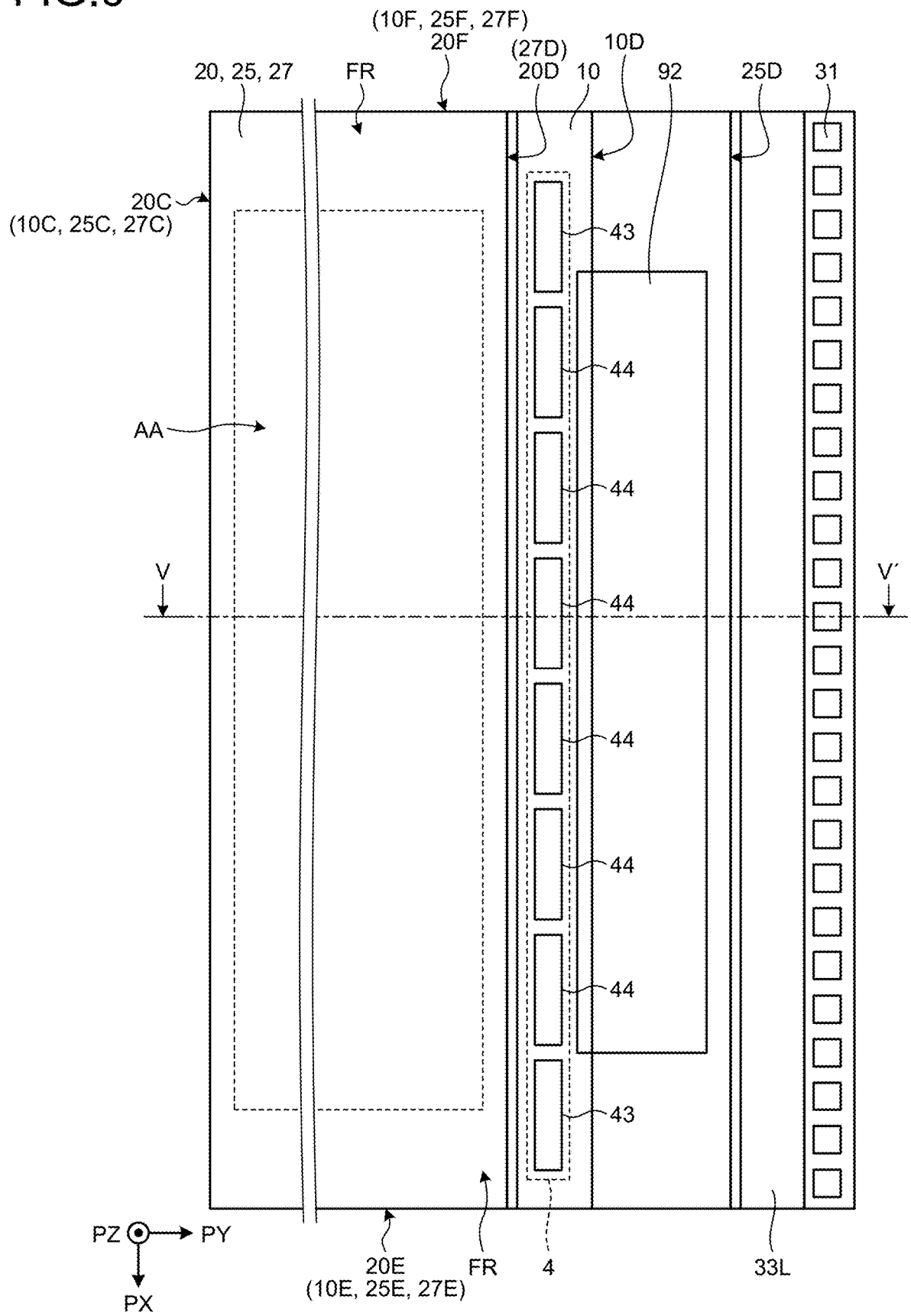
FIG. 6 is a plan view illustrating a planar surface of the display device of FIG. 1.
Figure 7:
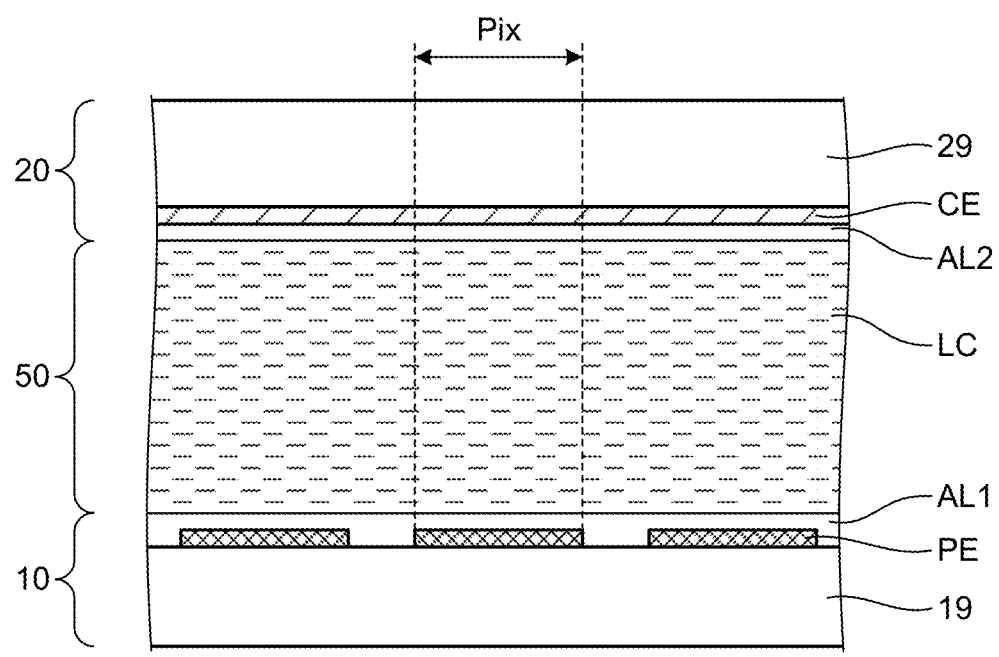
FIG. 7 is an enlarged sectional view obtained by enlarging a liquid crystal layer portion of FIG. 5.
Figure 8:
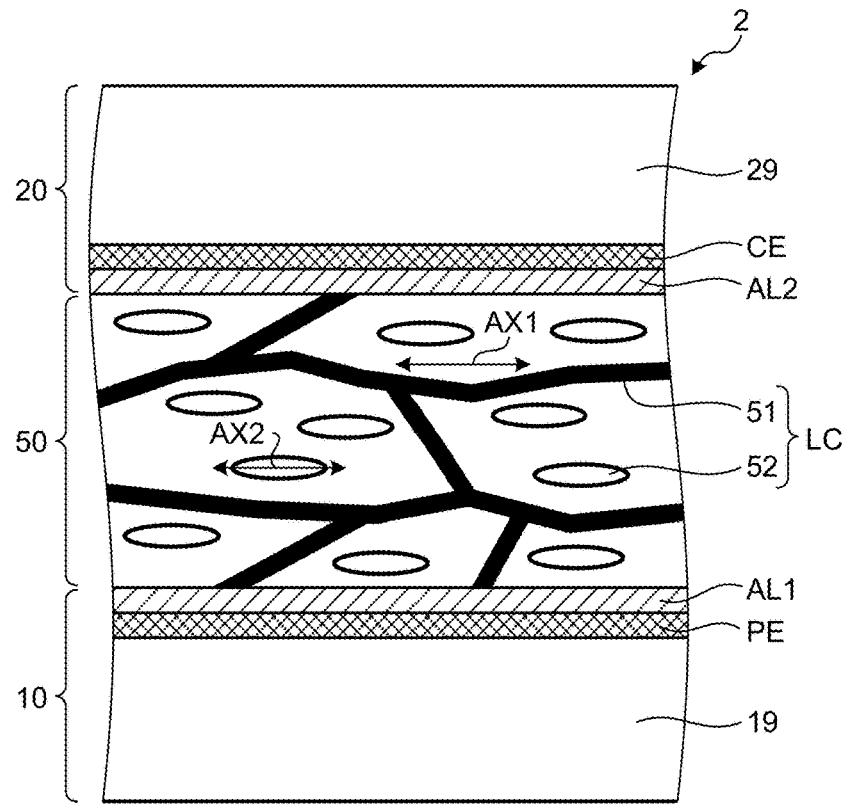
FIG. 8 is a sectional view for explaining a non-scattering state in the liquid crystal layer.
Figure 9:
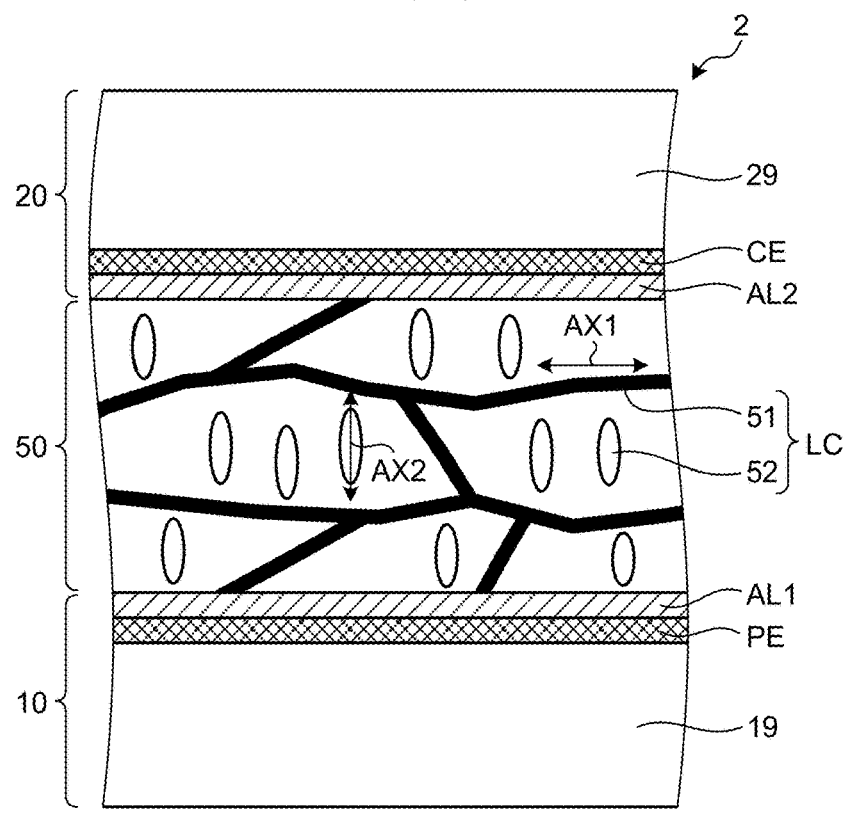
FIG. 9 is a sectional view for explaining the scattering state in the liquid crystal layer.

FIG. 4 is an explanatory diagram illustrating a relation between a voltage applied to the pixel electrode and a scattering state of the pixel. FIG. 5 is a sectional view illustrating an example of a section of the display device. FIG. 6 is a plan view illustrating a planar surface of the display device of FIG. 1. FIG. 7 is an enlarged sectional view obtained by enlarging the liquid crystal layer portion of FIG. 5. FIG. 8 is a sectional view for explaining a non-scattering state in the liquid crystal layer. FIG. 9 is a sectional view for explaining the scattering state in the liquid crystal layer.

If the gradation signal corresponding to the output gradation value of each of the pixels Pix is supplied to the above-described signal lines SL for the pixels Pix selected during the one vertical scan period GateScan, a voltage applied to the pixel electrode PE changes with the gradation signal. The change in the voltage applied to the pixel electrode PE changes the voltage between the pixel electrode PE and the common electrode CE. The scattering state of the liquid crystal layer 50 for each of the pixels Pix is controlled in accordance with the voltage applied to the pixel electrode PE, and the scattering ratio in the pixels Pix changes, as illustrated in FIG. 4.

As illustrated in FIG. 4, the change in the scattering ratio in the pixel Pix is smaller when the voltage applied to the pixel electrode PE is equal to or higher than a saturation voltage Vsat. Therefore, the drive circuit 4 changes the voltage applied to the pixel electrode PE in accordance with the vertical drive signal VDS within a voltage range Vdr lower than the saturation voltage Vsat.

As illustrated in FIG. 5, the display device 1 includes a light-transmitting first base member 25, the display panel 2, and a light-transmitting second base member 27. A protective layer 75 is provided on one surface of the light-transmitting first base member 25. A protective layer 76 is provided on one surface of the light-transmitting second base member 27.

The display panel 2 includes the array substrate 10, the counter substrate 20, and the liquid crystal layer 50. The counter substrate 20 faces a surface of the array substrate 10 in a direction orthogonal thereto (in the third direction PZ illustrated in FIG. 1). In the liquid crystal layer 50, the polymer-dispersed liquid crystals (to be described later) are sealed by the array substrate 10, the counter substrate 20, and the sealing portion 18.

As illustrated in FIGS. 5 and 6, the array substrate has a first principal surface 10A, a second principal surface 10B, a first side surface 10C, a second side surface 10D, a third side surface 10E, and a fourth side surface 10F. The first principal surface 10A and the second principal surface 10B are parallel flat surfaces. The first side surface 10C and the second side surface 10D are parallel flat surfaces. The third side surface 10E and the fourth side surface 10F are parallel flat surfaces.

As illustrated in FIGS. 5 and 6, the counter substrate has a first principal surface 20A, a second principal surface 20B, a first side surface 20C, a second side surface 20D, a third side surface 20E, and a fourth side surface 20F. The first principal surface 20A and the second principal surface 20B are parallel flat surfaces. The first side surface 20C and the second side surface 20D are parallel flat surfaces. The third side surface 20E and the fourth side surface 20F are parallel flat surfaces.

As illustrated in FIGS. 5 and 6, the first base member has a first principal surface 25A, a second principal surface 25B, a first side surface 25C, a second side surface 25D, a third side surface 25E, and a fourth side surface 25F. The first principal surface 25A and the second principal surface 25B are parallel flat surfaces. The first side surface 25C and the second side surface 25D are parallel flat surfaces. The third side surface 25E and the fourth side surface 25F are parallel flat surfaces.

The first base member 25 is bonded to the first principal surface 20A of the counter substrate 20 with an optical resin 23 interposed therebetween. The first base member 25 is a protective substrate for the counter substrate 20, and is formed of, for example, glass or a light-transmitting resin. When the first base member 25 is formed of glass material, the first base member 25 is also called cover glass. When the first base member 25 is formed of a light-transmitting resin, it may be flexible. The same base material as the first base member 25 may be bonded to the first principal surface 10A of the array substrate 10 with an optical resin interposed therebetween.

As illustrated in FIGS. 5 and 6, the second base member 27 has a first principal surface 27A, a second principal surface 27B, a first side surface 27C, a second side surface 27D, a third side surface 27E, and a fourth side surface 27F. The first principal surface 27A and the second principal surface 27B are parallel flat surfaces. The first side surface 27C and the second side surface 27D are parallel flat surfaces. The third side surface 27E and the fourth side surface 27F are parallel flat surfaces.

The second base member 27 is attached to the first principal surface 10A of the array substrate 10 with an optical resin 26 interposed therebetween. The second base member 27 is a protective substrate for the array substrate and is formed of, for example, glass or a light-transmitting resin. When the second base member 27 is formed of a glass base material, it is also called a cover glass. When the second base member 27 is formed of a light-transmitting resin, it may be flexible.

As illustrated in FIGS. 5 and 6, the light source 3 faces the second side surface 25D of the first base member 25. The light source 3 may also be called a side light source. As illustrated in FIG. 5, the light source 3 emits light-source light to the second side surface 25D of the first base member 25. The second side surface 25D of the first base member 25 facing the light source 3 serves as a plane of light incidence. The plane of light incidence facing the light source 3 may be the second side surface of the counter substrate 20 or the second side surface 27D of the second base member 27.

The light source 3 includes the light emitters 31 and a light guide 33L. The light emitters 31 includes the light emitter 33R of the first color (such as red), the light emitter 33G of the second color (such as green), and the light emitter 33B of the third color (such as blue). The light guide 33L guides the light emitted by the light emitter 33R of the first color, the light emitter 33G of the second color, and the light emitter 33B of the third color to the second side surface 25D of the first base member 25. The light guide 33L receives the light simultaneously from the light emitters 31, internally diffuses the received light, and emits the diffused light to the display panel 2. As a result, the distribution of light per unit area irradiating the second side surface 25D of the first base member 25 is made uniform.

The light guide 33L is a single light guide 33L formed integrally from the third side surface 25E to the fourth side surface 25F. The light guide 33L may be formed by arranging a plurality of divided light guides from the third side surface 25E to the fourth side surface 25F. The light guide 33L may be formed by arranging the divided light guides from the third side surface 25E to the fourth side surface 25F and connecting the adjacent light guides to each other.

The light emitters 31 and the light guide 33L are fixed together with an adhesive material or the like, and assembled to a support 33M to form a light source module. The support 33M is mounted so as to overlap the first principal surface 25A of the first base member 25, and is fixed to the first base member 25 with an adhesive material or the like.

The wiring substrate 93 (flexible printed circuit board or PCB substrate) is provided with an integrated circuit of the light source control circuit 32, and the light source control circuit 32 is coupled to the light source 3 through the wiring substrate 93 (flexible printed circuit board or PCB substrate). The wiring substrate 93 is fixed to the support 33M with an adhesive material or the like.

As illustrated in FIG. 5, the light-source light emitted from the light source 3 propagates in a direction (second direction PY) away from the second side surface 20D while being reflected by any of the first base member 25, the array substrate 10, the counter substrate 20, and the second base member 27.

As illustrated in FIG. 5, the light-source light that has propagated in any of the first base member 25, the array substrate 10, the counter substrate 20, and the second base member 27 is scattered by the pixels Pix including the liquid crystals in the scattering state, and the angle of incidence of the scattered light becomes an angle smaller than the critical angle. Thus, emission light 68 and 68A is emitted outward from the first principal surface 20A of the counter substrate 20 (the first principal surface 25A of the first base member 25) and the first principal surface 10A of the array substrate 10, respectively. The emission light 68 and 68A emitted outward from the first principal surface 20A of the counter substrate 20 and the first principal surface 10A of the array substrate 10, respectively, is viewed by a viewer.

Therefore, as illustrated in FIG. 6, the light emitters 31 are arranged at a predetermined pitch in a region corresponding to the first direction PX of the active region AA.

As illustrated in FIG. 6, the drive circuit 4 described above includes a plurality of integrated circuits of the gate drive circuit 43 and a plurality of integrated circuits of the source drive circuit 44.

The following describes the polymer-dispersed liquid crystals in the scattering state and the polymer-dispersed liquid crystals in the non-scattering state, using FIGS. 7 to 9.

As illustrated in FIG. 7, the array substrate 10 is provided with a first orientation film AL1. The counter substrate 20 is provided with a second orientation film AL2. When the orientation films are subjected to orientation treatment, for example, the orientation treatment is applied such that the orientation direction of the first orientation film AL1 is oriented toward one side of the first direction PX, and the orientation direction of the second orientation film AL2 is oriented toward the other side of the first direction PX. The first and the second orientation films AL1 and AL2 may be, for example, vertical orientation films, or may be orientation films oriented in the first direction PX in which the light emitters 31 are arranged. The orientation treatment is applied by rubbing treatment or photo-orientation treatment.

The polymer-dispersed liquid crystals LC of the liquid crystal layer 50 illustrated in FIG. 7 are sealed between the array substrate 10 and the counter substrate 20. Then, in a state where the monomer and the liquid crystals are oriented by the first and the second orientation films AL1 and AL2, the monomer is polymerized by ultraviolet rays or heat to form a three-dimensional mesh-like polymer network 51. This process forms the liquid crystal layer 50 including the reverse-mode polymer-dispersed liquid crystals LC in which liquid crystal molecules 52 are dispersed in gaps of the three-dimensional mesh-like polymer network 51 formed in the mesh shape.

Thus, the polymer-dispersed liquid crystals LC include the three-dimensional mesh-like polymer network 51 and the liquid crystal molecules 52.

The orientation of the liquid crystal molecules 52 is controlled by a voltage difference between the pixel electrode PE and the common electrode CE. The voltage applied to the pixel electrode PE changes the orientation of the liquid crystal molecules 52. The degree of scattering of light passing through the pixels Pix changes with change in the orientation of the liquid crystal molecules 52.

For example, as illustrated in FIG. 8, the direction of an optical axis AX1 of the polymer network 51 is substantially equal to the direction of an optical axis AX2 of the liquid crystal molecules 52 when no voltage is applied between the pixel electrode PE and the common electrode CE. The optical axis AX2 of the liquid crystal molecules 52 is parallel to the first direction PX (FIG. 6) of the liquid crystal layer 50. The optical axis AX1 of the polymer network 51 is parallel to the first direction PX of the liquid crystal layer 50 regardless of whether a voltage is applied.

Ordinary-ray refractive indices of the polymer network 51 and the liquid crystal molecules 52 are equal to each other. When no voltage is applied between the pixel electrode PE and the common electrode CE, the refractive index difference between the polymer network 51 and the liquid crystal molecules 52 is substantially zero in all directions. The liquid crystal layer 50 is placed in the non-scattering state of not scattering the light-source light. The light-source light propagates in a direction away from the light source 3 (the light emitter 31). When the liquid crystal layer 50 is in the non-scattering state of not scattering the light-source light, a background on the first principal surface 20A side of the counter substrate 20 is visible from the first principal surface 10A of the array substrate 10, and a background on the first principal surface 10A side of the array substrate 10 is visible from the first principal surface 20A of the counter substrate 20.

As illustrated in FIG. 9, in the space between the pixel electrode PE and the common electrode CE having a voltage applied thereto, the optical axis AX2 of the liquid crystal molecules 52 is inclined by an electric field generated between the pixel electrode PE and the common electrode CE. Since the optical axis AX1 of the polymer network 51 is not changed by the electric field, the direction of the optical axis AX1 of the polymer network 51 differs from the direction of the optical axis AX2 of the liquid crystal molecules 52. The light-source light is scattered in the pixel Pix including the pixel electrode PE having a voltage applied thereto. As described above, the viewer views a part of the scattered light-source light emitted outward from the first principal surface 10A of the array substrate 10 or the first principal surface 20A of the counter substrate 20.

In the pixel Pix including the pixel electrode PE having no voltage applied thereto, the background on the first principal surface 20A side of the counter substrate 20 is visible from the first principal surface 10A of the array substrate 10, and the background on the first principal surface 10A side of the array substrate 10 is visible from the first principal surface 20A of the counter substrate 20. In the display device 1 of the present embodiment, when the first input signal VS is received from the image transmitter 91, the voltage is applied to the pixel electrode PE of the pixel Pix for displaying an image, and an image based on the third input signal VCSA becomes visible together with the background. In this manner, the image is displayed in the display region when the polymer-dispersed liquid crystals LC are in the scattering state.

The light-source light is scattered in the pixel Pix including the pixel electrode PE having a voltage applied thereto, and emitted outward to display the image, which is displayed so as to be superimposed on the background. In other words, the display device 1 of the present embodiment can display the image so as to be superimposed on the background by combining the emission light 68 or 68A with the background.

A potential of each of the pixel electrodes PE (refer to FIG. 7) written during the one vertical scan period GateScan illustrated in FIG. 3 needs to be held during at least one of the first color light emission period RON, the second color light emission period GON, and the third color light emission period BON after each vertical scan period GateScan. If the written potential of each of the pixel electrodes PE (refer to FIG. 7) cannot be held during at least one of the first color light emission period RON, the second color light emission period GON, and the third color light emission period BON after each vertical scan period GateScan, what are called flickers or the like are likely to occur. In other words, in order to shorten the one vertical scan period GateScan serving as a time for selecting the scan lines and increase the visibility in the driving based on what is called the field-sequential system, the written potential of each of the pixel electrodes PE (refer to FIG. 7) is required to be easily held during each of the first color light emission period RON, the second color light emission period GON, and the third color light emission period BON.

Figure 10:
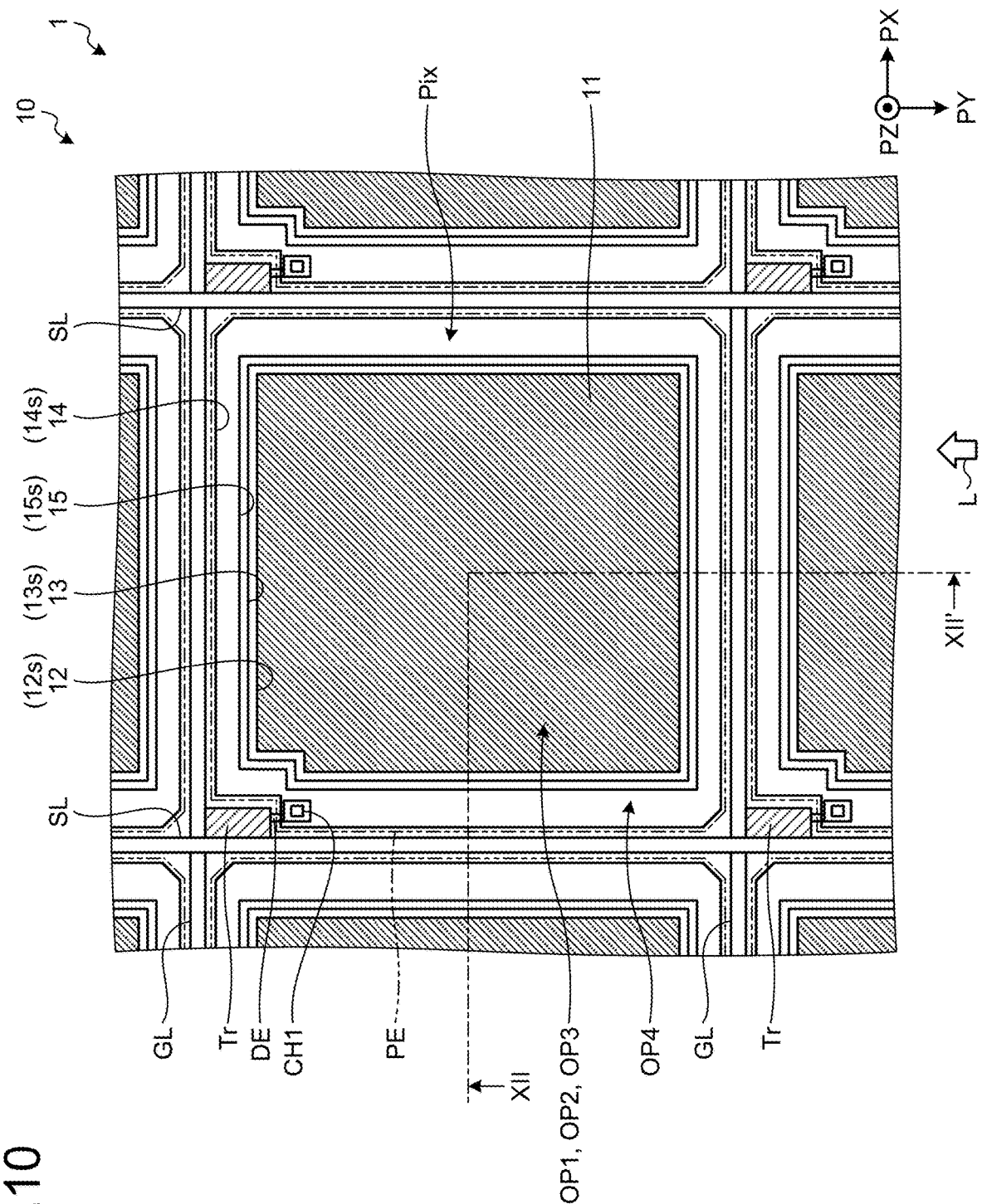
FIG. 10 is a plan view illustrating scan lines, signal lines, switching elements, and insulating films for the pixels according to the first embodiment.

FIG. 10 is a plan view illustrating the scan lines, the signal lines, the switching elements, and insulating films for the pixels according to the first embodiment. As illustrated in FIG. 10, the pixel Pix is provided in an area surrounded by the adjacent scan lines GL and the adjacent signal lines SL. The pixels Pix are arranged in a matrix. Each of the pixels Pix includes the pixel electrode PE and the switching element Tr. The pixel electrodes PE are each provided in the area surrounded by the adjacent scan lines GL and the adjacent signal lines SL, and are arranged in a matrix so as to be separated from one another. For ease of viewing, FIG. 10 illustrates each of the pixel electrodes PE with a long dashed double-short dashed line.

The scan line GL is arranged between the pixel electrodes PE adjacent in the second direction PY and extends in the first direction PX. The signal line SL is arranged between the pixel electrodes PE adjacent in the first direction PX and extends in the second direction PY.

The switching element Tr is provided at an intersecting portion between the scan line GL and the signal line SL. A drain electrode DE of the switching element Tr is electrically coupled to the pixel electrode PE through a contact hole CH1.

As illustrated in FIG. 10, light-source light L emitted from the light source 3 (refer to FIG. 5) is incident in the second direction PY serving as a direction of incidence. The direction of incidence refers to a direction from the second side surface 20D closest to the light source 3 (refer to FIG. 5) toward the first side surface 20C that is a surface opposite to the second side surface 20D. When the direction of incidence of the light-source light L is the second direction PY, the length in the first direction PX of the switching element Tr is shorter than the length in the second direction PY of the switching element Tr. This configuration reduces the length of the switching element Tr in a direction intersecting the direction of incidence of the light-source light L, and thereby, reduces the effect of the light leakage.

Various insulating films such as an undercoat film 11, a gate insulating film 12, an interlayer insulating film 13, an organic insulating film 14, and a capacitance insulating film 15 are stacked on a first light-transmitting substrate 19 (refer to FIG. 12) of the array substrate 10. Of these insulating films, the gate insulating film 12, the interlayer insulating film 13, the organic insulating film 14, and the capacitance insulating film 15 are provided in a grid pattern along the scan lines GL and the signal lines SL.

In other words, the gate insulating film 12 is provided with a first opening OP1 in an area overlapping the pixel electrode PE. The undercoat film 11 is provided continuously over an area overlapping the scan lines GL and the signal lines SL, and over the areas overlapping the first openings OP1. For ease of viewing, FIG. 12 illustrates the first openings OP1 with hatch lines.

In the same manner, the interlayer insulating film 13 is provided with a second opening OP2 in an area overlapping the pixel electrode PE. The capacitance insulating film 15 is provided with a third opening OP3 in an area overlapping the pixel electrode PE. The organic insulating film 14 a fourth opening OP4 provided in an area overlapping the pixel electrode PE. The first opening OP1 of the gate insulating film 12, the second opening OP2 of the interlayer insulating film 13, the third opening OP3 of the capacitance insulating film 15, and the fourth opening OP4 of the organic insulating film 14 are provided so as to overlap one another in plan view. A detailed multilayered configuration of the various insulating films, the pixel electrode PE, and the switching element Tr will be described later with reference to FIG. 12.

Figure 11:
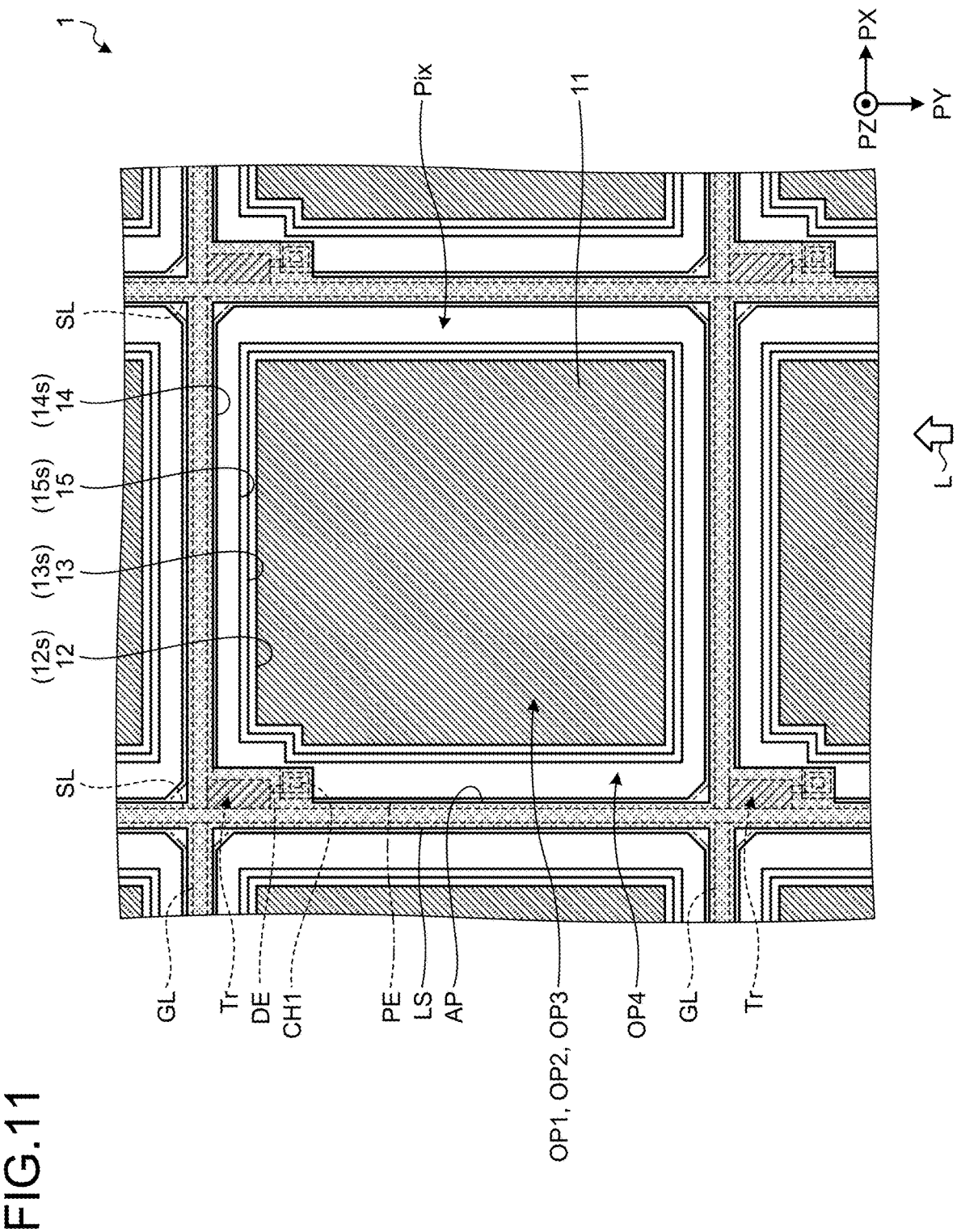
FIG. 11 is a plan view illustrating a light-blocking layer for the pixels according to the first embodiment.

FIG. 11 is a plan view illustrating the light-blocking layer for the pixels according to the first embodiment. As illustrated in FIG. 11, a light-blocking layer LS is provided on the counter substrate 20 (refer to FIG. 12), and has a grid pattern that covers over the scan lines GL and the signal lines SL along the scan lines GL and the signal lines SL in plan view. In more detail, the light-blocking layer LS includes portions extending in the first direction PX so as to overlap the scan lines GL, and portions extending in the second direction PY so as to overlap the signal lines SL and the switching elements Tr.

Figure 12:
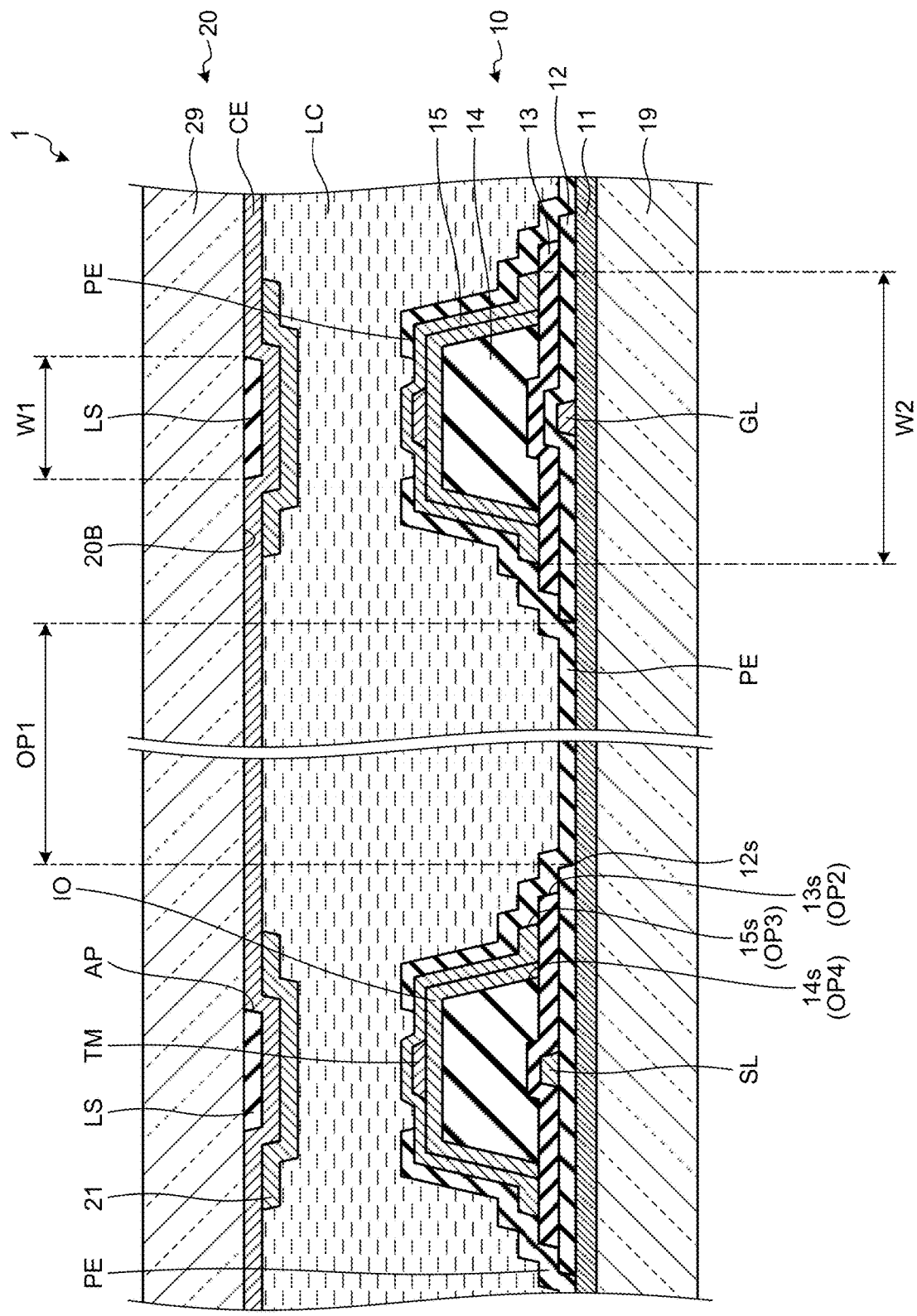
FIG. 12 is a sectional view along XII-XII' of FIG. 10.

The light-blocking layer LS has a width larger than that of the scan line GL, the signal line SL, and the metal layer TM (refer to FIG. 12). With this configuration, the light-blocking layer LS restrains reflected light reflected by edges of the signal lines SL, the scan lines GL, and the metal layer TM (refer to FIG. 12) from being emitted from the display panel 2. As a result, the visibility of images is improved in the display device 1.

The following describes a sectional configuration of the display device 1. FIG. 12 is a sectional view along XII-XII' of FIG. 10.

In the following description, the direction from the array substrate 10 toward the counter substrate 20 is referred to as "upper side" or simply "above" or "on". The direction from the counter substrate 20 toward the array substrate 10 is referred to as "lower side" or simply "below".

As illustrated in FIG. 12, the array substrate 10 includes the first light-transmitting substrate 19 formed of glass, for example. The first light-transmitting substrate 19 may be a resin such as polyethylene terephthalate, as long as having a light-transmitting capability.

The array substrate 10 includes, for example, the undercoat film 11, the gate insulating film 12, the interlayer insulating film 13, the organic insulating film 14, the capacitance insulating film 15, the scan line GL, the signal line SL, the holding capacitance electrode IO, the metal layer TM, and the pixel electrode PE on a side of the first light-transmitting substrate 19 facing the counter substrate 20.

The undercoat film 11 is provided on the first light-transmitting substrate 19 so as to cover the principal surface of the first light-transmitting substrate 19. The scan line GL is provided on the undercoat film 11. The scan line GL is wiring of a metal such as molybdenum (Mo) or aluminum (Al), a multilayered body of these metals, or an alloy thereof.

The gate insulating film 12 is provided on the undercoat film 11 so as to cover the scan line GL. The first opening OP1 of the gate insulating film 12 is provided in an area overlapping a central portion of the pixel electrode PE (portion excluding the outer edge of the pixel electrode PE overlapping the organic insulating film 14). The signal line SL is provided on the gate insulating film 12. The signal line SL is wiring of a metal such as aluminum or an alloy thereof.

The interlayer insulating film 13 is provided on the gate insulating film 12 so as to cover the signal line SL. The second opening OP2 of the interlayer insulating film 13 is provided in an area overlapping the first opening OP1 of the gate insulating film 12 and the central portion of the pixel electrode PE. The undercoat film 11, the gate insulating film 12, and the interlayer insulating film 13 are each formed of, for example, a light-transmitting inorganic material such as silicon oxide or silicon nitride. The composition of the undercoat film 11 is not limited to a single-layered film, but may be made of a plurality of layers of inorganic insulating films.

The organic insulating film 14 is provided on the interlayer insulating film 13 in an area overlapping the signal lines SL and the scan lines GL. The fourth opening OP4 of the organic insulating film 14 is provided in the area overlapping the central portion of the pixel electrode PE. That is, the organic insulating film 14 has a grid pattern that covers over the scan lines GL and the signal lines SL along the scan lines GL and the signal lines SL. The organic insulating film 14 is formed of, for example, a light-transmitting organic insulating material such as an acrylic resin. The organic insulating film 14 has a greater film thickness than that of other insulating films formed of an inorganic material. As a result, the switching element Tr, the scan line GL, and the signal line SL are located at relatively long distances from the holding capacitance electrode IO and are thereby less affected by a common potential from the holding capacitance electrode IO.

The holding capacitance electrode IO is provided on the organic insulating film 14. The holding capacitance electrode IO is formed of a light-transmitting conductive material such as indium tin oxide (ITO). The holding capacitance electrode IO has a grid pattern that covers over the scan lines GL and the signal lines SL along the scan lines GL and the signal lines SL. The holding capacitance electrode IO has an opening provided with no light-transmitting conductive material in the area overlapping the central portion of the pixel electrode PE.

The conductive metal layer TM is provided on a portion of the holding capacitance electrode IO. The conductive metal layer TM is wiring of a metal such as molybdenum (Mo) or aluminum (Al), a multilayered body of these metals, or an alloy thereof. The metal layer TM is provided so as to overlap the scan lines GL and the signal lines SL, and has a grid pattern along the scan lines GL and the signal lines SL. In other words, the metal layer TM has openings in areas overlapping the pixel electrodes PE.

The metal layer TM only needs to be stacked on the holding capacitance electrode IO, and may be located below the holding capacitance electrode IO. The metal layer TM has lower electrical resistance than that of the holding capacitance electrode IO. Therefore, the holding capacitance HC is less variable between the pixels Pix.

The capacitance insulating film 15 is provided so as to cover the holding capacitance electrode IO and the metal layer TM. The third opening OP3 of the capacitance insulating film 15 is provided in the area overlapping the central portion of the pixel electrode PE. The capacitance insulating film 15 is formed of, for example, a light-transmitting inorganic material such as silicon oxide or silicon nitride.

The pixel electrode PE is provided on the capacitance insulating film 15. The pixel electrode PE is formed of a light-transmitting conductive material such as ITO. As described above, the pixel electrodes PE are partitioned on a pixel Pix basis. The pixel electrode PE on the left side and the pixel electrode PE in the center in FIG. 12 are arranged apart in the first direction PX with the metal layer TM interposed therebetween. The pixel electrode PE on the right side and the pixel electrode PE in the center in FIG. 12 are arranged apart in the second direction PY with the metal layer TM interposed therebetween.

In more detail, an outer edge of each of the pixel electrodes PE is provided in a position overlapping a side surface 14s and an upper surface of the organic insulating film 14, and faces the holding capacitance electrode IO with the capacitance insulating film 15 interposed therebetween. A portion of the outer edge of the pixel electrode PE overlaps a slant surface (side surface 14s) where the thickness of the organic insulating film 14 changes. This configuration stabilizes the behavior of the liquid crystal molecules between the adjacent pixels Pix.

The central portion of the pixel electrode PE is provided so as to cover the first opening OP1 of the gate insulating film 12, the second opening OP2 of the interlayer insulating film 13, and the third opening OP3 of the capacitance insulating film 15. The pixel electrode PE is stacked directly on the undercoat film 11 in the area overlapping the first opening OP1 of the gate insulating film 12.

Thus, in the array substrate 10, the first opening OP1 of the gate insulating film 12, the second opening OP2 of the interlayer insulating film 13, and the third opening OP3 of the capacitance insulating film 15 are provided in the area overlapping the central portion of the pixel electrode PE. In addition, the fourth opening OP4 of the organic insulating film 14 is provided in the area overlapping the central portion of the pixel electrode PE. The first opening OP1 of the gate insulating film 12, the second opening OP2 of the interlayer insulating film 13, the third opening OP3 of the capacitance insulating film 15, and the fourth opening OP4 of the organic insulating film 14 are provided in the overlapping area in plan view. In other words, in the area overlapping the central portion of the pixel electrode PE, an area is formed in which only the undercoat film 11 is provided as an insulating film, with none of the gate insulating film 12, the interlayer insulating film 13, the capacitance insulating film 15, and the organic insulating film 14 being provided.

The thickness of the insulating film overlapping the central portion of the pixel electrode PE in plan view (thickness of the undercoat film 11) is smaller than the thickness of the insulating films overlapping the signal lines SL and the scan lines GL (total thickness of the undercoat film 11, the gate insulating film 12, the interlayer insulating film 13, the organic insulating film 14, and the capacitance insulating film 15). With this configuration, the transmittance of light is relatively higher, and thus, the light-transmitting capability is relatively higher in the area overlapping the central portion of the pixel electrode PE than above the scan lines GL and the signal lines SL.

A side surface 12s of the first opening OP1, a side surface 13s of the second opening OP2, a side surface 15s of the third opening OP3, and the side surface 14s of the fourth opening OP4 are arranged so as to be shifted from one another. The side surface 12s of the first opening OP1, the side surface 13s of the second opening OP2, the side surface 15s of the third opening OP3, and the side surface 14s of the fourth opening OP4 are arranged in this order from the central portion of the pixel electrode PE toward the outer edge.

Specifically, as illustrated in FIG. 10, the side surface 12s of the first opening OP1 of the gate insulating film 12 is located inside the side surface 13s of the second opening OP2 of the interlayer insulating film 13 (on the central portion side of the pixel electrode PE) in plan view. The side surface 13s of the second opening OP2 of the interlayer insulating film 13 is located inside the side surface 15s of the third opening OP3 of the capacitance insulating film 15 (on the central portion side of the pixel electrode PE) in plan view. The side surface 15s of the third opening OP3 of the capacitance insulating film 15 is located inside the side surface 14s of the fourth opening OP4 of the organic insulating film 14 (on the central portion side of the pixel electrode PE) in plan view.

The pixel electrode PE is provided so as to cover a plurality of steps formed by the side surface 12s of the first opening OP1 of the gate insulating film 12, the side surface 13s of the second opening OP2 of the interlayer insulating film 13, and the side surface 15s of the third opening OP3 of the capacitance insulating film 15.

With the above-described configuration, the insulating film is formed to be gradually thicker from the side surface 12s of the first opening OP1 of the gate insulating film 12 to an area overlapping the signal lines SL and the scan lines GL. As a result, the transmittance of light gradually changes from the side surface 12s of the first opening OP1 of the gate insulating film 12 to the area overlapping the signal lines SL and the scan lines GL. In other words, the transmittance of light can be restrained from sharply changing compared with a case where the side surface 12s of the first opening OP1, the side surface 13s of the second opening OP2, and the side surface 15s of the third opening OP3 are provided so as to overlap one another.

As illustrated in FIG. 12, the counter substrate 20 includes a second light-transmitting substrate 29 formed of glass, for example. The second light-transmitting substrate 29 is provided so as to face the first light-transmitting substrate 19 of the array substrate 10. The second light-transmitting substrate 29 may be a resin such as polyethylene terephthalate, as long as having a light-transmitting capability.

The light-blocking layer LS, the common electrode CE, a protective film 21, and the second orientation film AL2 (refer to FIG. 14) are provided on the surface (second principal surface 20B) of the second light-transmitting substrate 29 that faces the array substrate 10. The light-blocking layer LS is provided between the second light-transmitting substrate 29 and the common electrode CE. As described above, the light-blocking layer LS is provided in the area overlapping the scan lines GL, the signal lines SL, and the switching elements Tr (refer to FIG. 10).

In the present embodiment, a width W1 of the light-blocking layer LS is larger than the width of the signal line SL and the width of the scan line GL. The width W1 of the light-blocking layer LS is smaller than a width W2 of the capacitance insulating film 15. The width W1 of the light-blocking layer LS is smaller than the width of the gate insulating film 12 and the width of the interlayer insulating film 13. That is, the light-blocking layer LS is provided in an area that overlaps none of the first opening OP1 of the gate insulating film 12, the second opening OP2 of the interlayer insulating film 13, and the third opening OP3 of the capacitance insulating film 15. The light-blocking layer LS can reduce the outward leakage of the light reflected or scattered by the signal lines SL and the scan lines GL. In addition, since the width W1 of the light-blocking layer LS is smaller than the width W2 of the capacitance insulating film 15, the transmittance of light can be improved in the area overlapping the central portion of the pixel electrode PE.

The common electrode CE is provided on the second principal surface 20B of the second light-transmitting substrate 29 so as to cover the light-blocking layer LS. The common electrode CE is formed of a light-transmitting conductive material such as ITO. The protective film 21 and the second orientation film AL2 (refer to FIG. 14) are provided on a surface of the common electrode CE. The protective film 21 is formed of an inorganic insulating material having an insulating capability and a light-transmitting capability, such as silicon nitride or silicon oxide. The second orientation film AL2 is provided on the array substrate 10 side of the protective film 21. The protective film 21 may be a light-blocking inorganic insulating film.

The following describes a detailed configuration example of the switching element Tr. FIG. 13 is a plan view illustrating a configuration example of the switching element illustrated in FIG. 10. As illustrated in FIG. 13, the switching element Tr includes semiconductor layers SC, a source electrode SE, a drain electrode DE, a gate electrode GE, and an auxiliary gate electrode GEs.

The gate electrode GE is formed integrally with and of the same material as the scan line GL. The gate electrode GE extends in a direction that intersects the extending direction of the scan line GL, that is, the second direction PY.

The semiconductor layers SC are oxide semiconductors, for example. The semiconductor layers SC may be formed of, for example, polycrystalline silicon or amorphous silicon. In the example illustrated in FIG. 13, the switching element Tr includes five of the semiconductor layers SC. The five semiconductor layers SC are arranged in the second direction PY so as to overlap the gate electrode GE and to be spaced along the direction of extension of the gate electrode GE.

The auxiliary gate electrode GEs is provided so as to overlap the gate electrode GE and the semiconductor layers SC. Specifically, the auxiliary gate electrode GEs includes a first electrode portion GEsa and a second electrode portion GEsb. The first electrode portion GEsa extends in the second direction PY so as to overlap the gate electrode GE and the semiconductor layers SC. The second electrode portion GEsb is coupled to the first electrode portion GEsa and extends in the first direction PX so as to overlap the scan line GL. The second electrode portion GEsb is electrically coupled to the scan line GL through a contact hole CH5 at any desired location. That is, the auxiliary gate electrode GEs is supplied with a signal having the same potential as that of a gate drive signal supplied to the scan line GL.

The source electrode SE is formed integrally with the signal line SL and extends in the second direction PY. In other words, a portion of the signal line SL coupled to the semiconductor layers SC serves as the source electrode SE. The source electrode SE is coupled to one end side of each of the semiconductor layers SC. The source electrode SE is formed by the single-layer signal line SL.

The drain electrode DE extends in the second direction PY along the source electrode SE. The drain electrode DE is arranged adjacent in the first direction PX to the source electrode SE with a gap interposed therebetween. The drain electrode DE is coupled to the other end side of each of the semiconductor layers SC.

At an end in the second direction PY of the drain electrode DE, a coupling portion DEA is provided in an area overlapping the pixel electrode PE. The coupling portion DEA is electrically coupled to the pixel electrode PE through contact holes CH1 and CH2.

The configuration of the switching element Tr illustrated in FIG. 13 is merely an example and can be changed as appropriate. For example, although the five semiconductor layers SC are coupled in parallel, the number of the semiconductor layers SC is not limited to five, but may be four or smaller, or six or larger.

Figure 14:
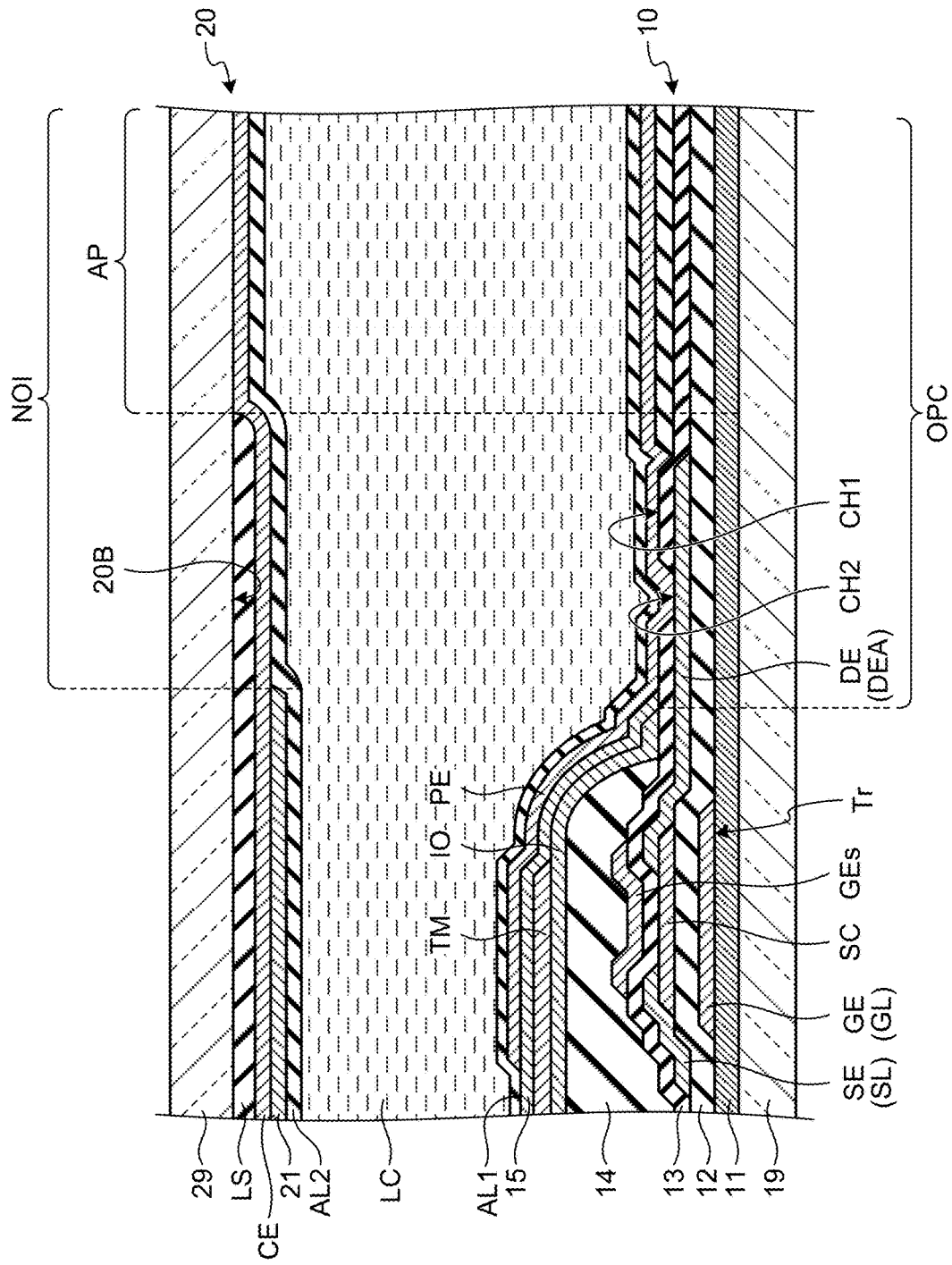
FIG. 14 is a sectional view along XIV-XIV' of FIG. 13.

FIG. 14 is a sectional view along XIV-XIV' of FIG. 13. As illustrated in FIG. 14, the gate electrode GE formed integrally with the scan line GL is provided on the undercoat film 11. The gate insulating film 12 is provided on the undercoat film 11 so as to cover the gate electrode GE. The semiconductor layer SC is provided on the gate insulating film 12 in a position overlapping the gate electrode GE. That is, the gate insulating film 12 is provided between the gate electrode GE of the switching device Tr and the semiconductor layer SC in a direction orthogonal to the first light-transmitting substrate 19. The source electrode SE formed integrally with the signal line SL and the drain electrode DE are provided on the gate insulating film 12, and are each coupled to the semiconductor layer SC.

The interlayer insulating film 13 is provided on the gate insulating film 12 so as to cover the source electrode SE, the drain electrode DE, and the semiconductor layer SC. The auxiliary gate electrode GEs is provided on the interlayer insulating film 13 in a position overlapping the semiconductor layer SC and the gate electrode GE. The interlayer insulating film 13 is provided between the auxiliary gate electrode GEs and the semiconductor layer SC in the direction orthogonal to the first light-transmitting substrate 19. The semiconductor layer SC is disposed between the gate electrode GE and the auxiliary gate electrode GEs in the direction orthogonal to the first light-transmitting substrate 19.

The organic insulating film 14 is provided on the interlayer insulating film 13 so as to cover the auxiliary gate electrode GEs. In other words, the organic insulating film 14 is provided in an area overlapping the switching element Tr. The holding capacitance electrode IO and the metal layer TM are provided on the organic insulating film 14 in the area overlapping the switching element Tr. The metal layer TM has a larger area than that of the semiconductor layer SC of the switching element Tr. This configuration can reduce the light leakage of the switching element Tr.

The capacitance insulating film 15 is provided so as to cover the holding capacitance electrode IO and the metal layer TM. The pixel electrode PE is provided on the capacitance insulating film 15. The drain electrode DE and the coupling portion DEA extend to an area overlapping an opening OPC of the holding capacitance electrode IO. The interlayer insulating film 13 is provided between the set of the drain electrode DE and the coupling portion DEA and the pixel electrode PE in the area overlapping the opening OPC. In the area overlapping the opening OPC of the holding capacitance electrode IO, the pixel electrode PE is electrically coupled to the coupling portion DEA of the drain electrode DE through the contact hole CH1 passing through the capacitance insulating film 15 and the contact hole CH2 passing through the interlayer insulating film 13. The first orientation film AL1 is provided on the pixel electrode PE. The illustration of the first and the second orientation films AL1 and AL2 is omitted in FIG. 12 explained above.

The protective film 21 provided on the counter substrate 20 is formed in a position overlapping the interlayer insulating film 13. In an area overlapping the opening AP of the light-blocking layer LS, the common electrode CE and the second orientation film AL2 are directly stacked without interposing the protective film 21 therebetween. As a result, the planar shape of the protective film 21 has a grid pattern, thus creating non-overlapping regions NOI of the protective film 21. The protective film 21 is not formed in the opening AP of the light-blocking layer LS. However, the protective film 21 may be provided so as to cover the entire surface of the common electrode CE.

The configuration of the display device 1 described above is merely an example and can be changed as appropriate. For example, the metal layer TM illustrated in FIG. 12 may be omitted. In FIG. 12, the steps formed by the side surface 12s of the gate insulating film 12, the side surface 13s of the interlayer insulating film 13, and the side surface 15s of the capacitance insulating film 15 are illustrated in a highlighted manner for ease of understanding, but each of the side surfaces 12s, 13s, and 15s may be formed in a gradual taper shape.

First Modification of First Embodiment

Figure 15:
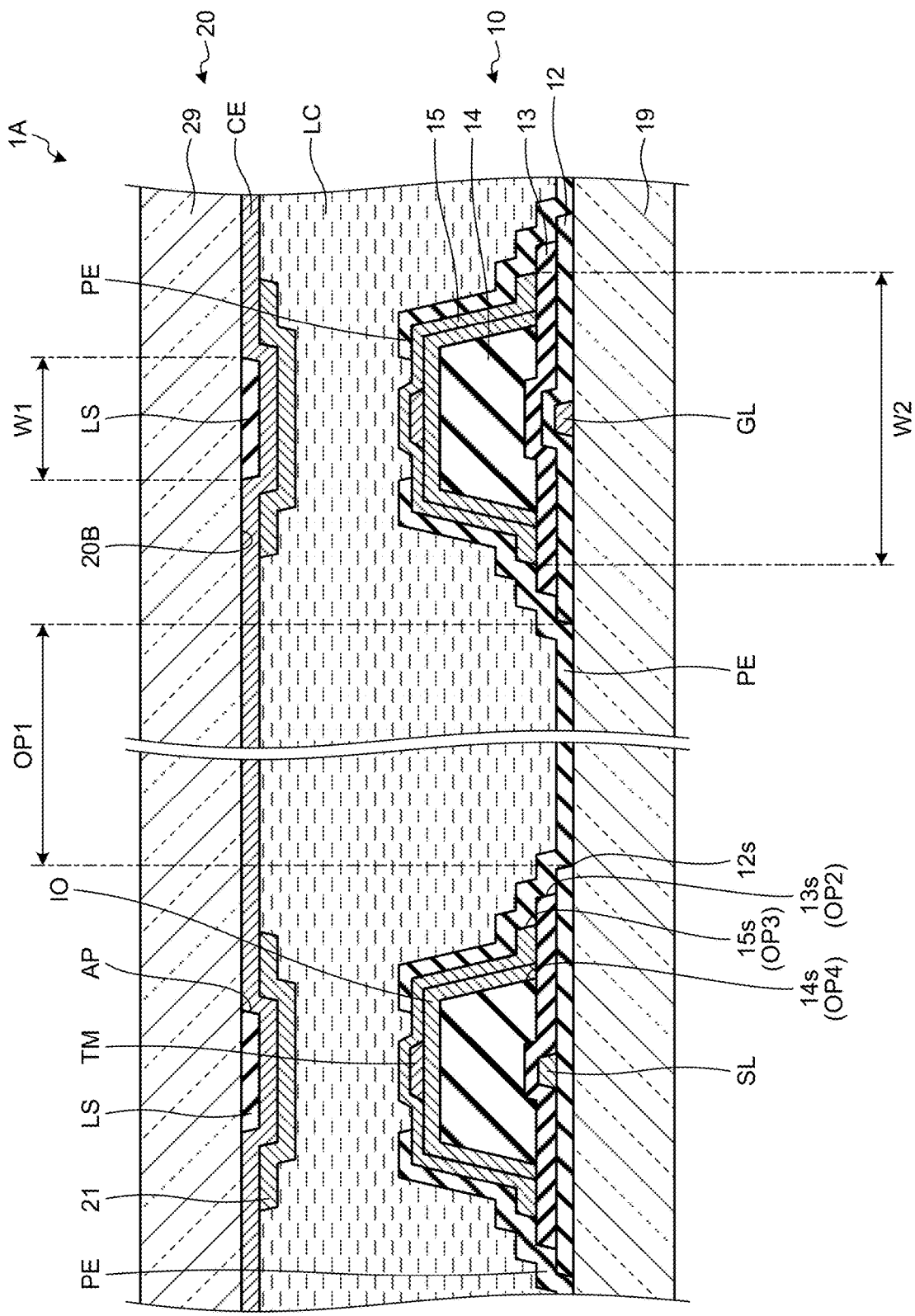
FIG. 15 is a sectional view schematically illustrating a display device according to a first modification of the first embodiment.

FIG. 15 is a sectional view schematically illustrating a display device according to a first modification of the first embodiment. In the following description, the same components as those described in the embodiment above are denoted by the same reference numerals, and the description thereof will not be repeated.

As illustrated in FIG. 15, the configuration of a display device 1A according to the first modification of the first embodiment differs from that in the first embodiment described above in that the undercoat film 11 is not provided. In the present embodiment, the scan line GL is provided on the principal surface of the first light-transmitting substrate 19. The gate insulating film 12 is provided on the principal surface of the first light-transmitting substrate 19 so as to cover the scan line GL.

The multilayered configuration of the interlayer insulating film 13, the organic insulating film 14, the capacitance insulating film 15, and the other components provided on the gate insulating film 12, and the configuration of the first opening OP1, the second opening OP2, the third opening OP3, and the fourth opening OP4 of the respective insulating films are the same as those of the first embodiment described above, and will not be repeatedly described.

In the first modification, the pixel electrode PE is directly stacked on the principal surface of the first light-transmitting substrate 19 in the area overlapping the first opening OP1 of the gate insulating film 12. With this configuration, in the first modification, the undercoat film 11 is not provided as compared with the first embodiment described above. Therefore, the transmittance of light can be improved, and thus, the light-transmitting capability is improved in the area overlapping the central portion of the pixel electrode PE.

Second Embodiment

Figure 16:
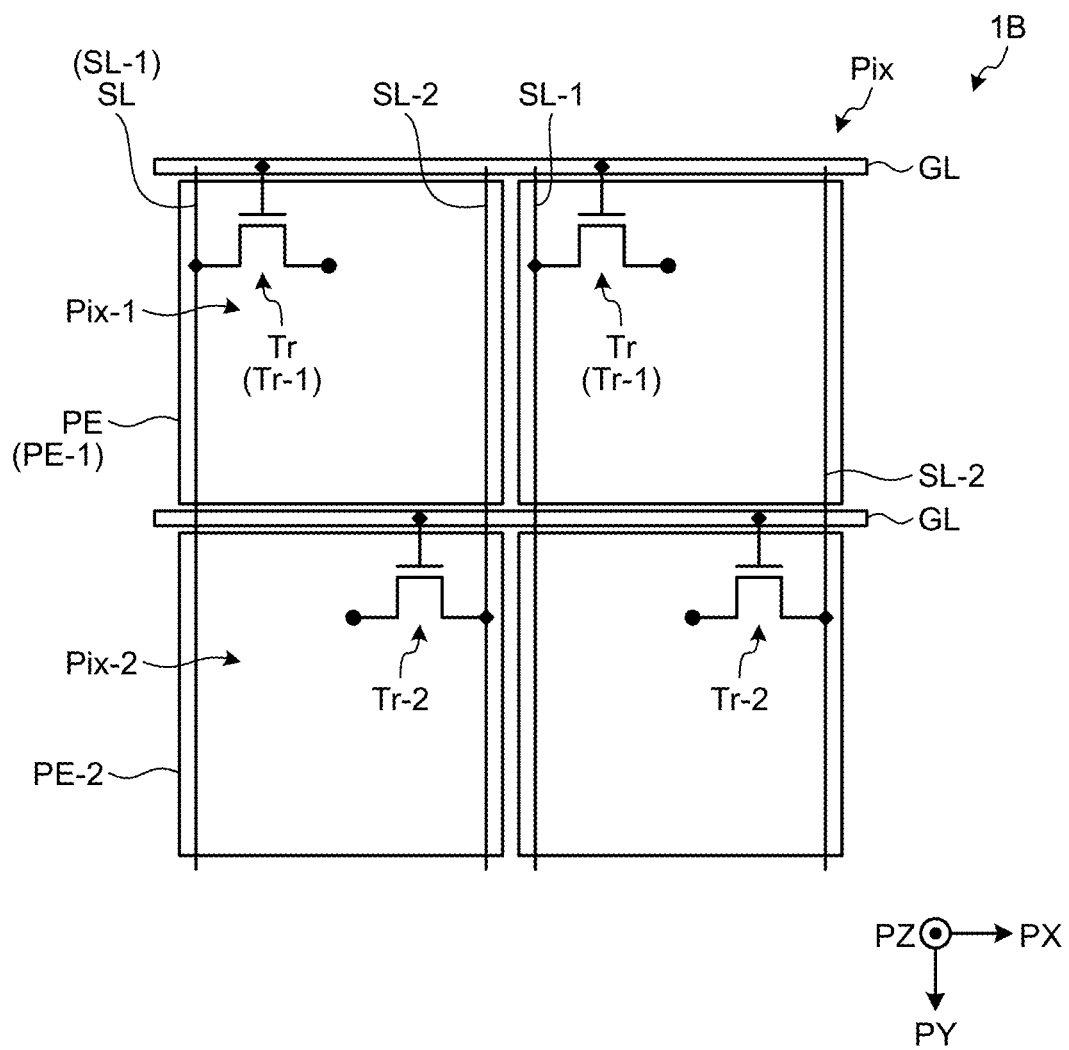
FIG. 16 is a circuit diagram illustrating a pixel array of a display device according to a second embodiment

FIG. 16 is a circuit diagram illustrating a pixel array of a display device according to a second embodiment. As illustrated in FIG. 16, in a display device 1B according to the second embodiment, two signal lines SL is provided for one pixel column. The scan line GL is provided for each pixel row.

The following describes a coupling configuration of the pixels Pix in one pixel column to the scan lines GL and the signal lines SL. One pixel column includes a first pixel Pix-1 and a second pixel Pix-2 arranged in the second direction PY. The first pixel Pix-1 includes a first pixel electrode PE-1 and a first switching element Tr-1. The second pixel Pix-2 includes a second pixel electrode PE-2 and a second switching element Tr-2.

In the following description, the first pixel Pix-1 and the second pixel Pix-2 will each be simply referred to as the pixel Pix when they need not be distinguished from each other. In the same manner, the first pixel electrode PE-1 and the second pixel electrode PE-2 will each be simply referred to as the pixel electrode PE when they need not be distinguished from each other. The first switching element Tr-1 and the second switching element Tr-2 will each be simply referred to as the switching element Tr when they need not be distinguished from each other.

A first signal line SL-1 is provided on the left side of the pixel column (the first pixel Pix-1 and the second pixel Pix-2) and extends in the second direction PY. A second signal line SL-2 is provided on the right side of the pixel column (the first pixel Pix-1 and the second pixel Pix-2) and extends in the second direction PY.

In the first switching element Tr-1, the source electrode SE (refer to FIG. 13) is coupled to the first signal line SL-1; the gate electrode GE (refer to FIG. 13) is coupled to the scan line GL in the first row; and the drain electrode DE (refer to FIG. 13) is coupled to the first pixel electrode PE-1.

In the second switching element Tr-2, the source electrode SE (refer to FIG. 13) is coupled to the second signal line SL-2; the gate electrode GE (refer to FIG. 13) is coupled to the scan line GL in the second row; and the drain electrode DE (refer to FIG. 13) is coupled to the second pixel electrode PE-2.

Thus, the first signal line SL-1 is electrically coupled to the first pixel electrode PE-1 through the first switching element Tr-1. The second signal line SL-2 is electrically coupled to the second pixel electrode PE-2 through the second switching element Tr-2.

In the present embodiment, the gate drive circuit 43 (refer to FIG. 2) supplies the gate drive signal simultaneously to the scan lines GL in two pixel rows. This operation simultaneously selects the two pixel rows.

The source drive circuit 44 (refer to FIG. 2) supplies the gradation signal to each of the first signal line SL-1 and the second signal line SL-2. This operation writes the gradation signal simultaneously to each of the pixels Pix in the two selected pixel rows. The source drive circuit 44 (refer to FIG. 2) sequentially supplies the gradation signal to each pixel column, that is, to each set of the two signal lines SL (the first signal line SL-1 and the second signal line SL-2) during a period when the gate drive signal is on.

With the above-described configuration, in the second embodiment, the period for writing the gradation signals to the pixels Pix can be made approximately twice longer that in a case where the pixel row is sequentially selected for each of the scan lines GL and the gradation signal is written for each of the signal lines SL.

Figure 17:
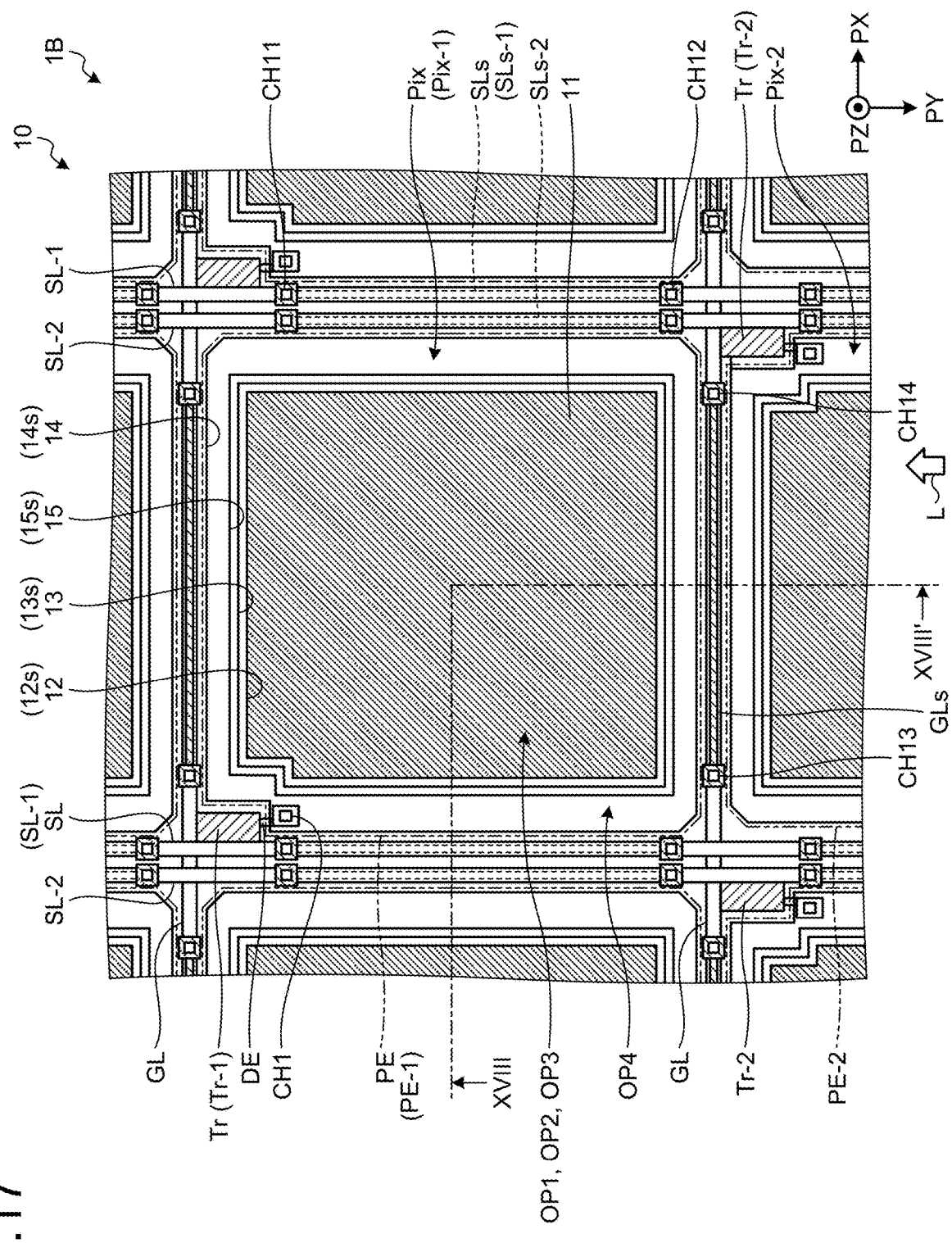
FIG. 17 is a plan view illustrating the scan lines, the signal lines, the switching elements, and the insulating films for the pixels according to the second embodiment.

FIG. 17 is a plan view illustrating the scan lines, the signal lines, the switching elements, and the insulating films for the pixels according to the second embodiment. As illustrated in FIG. 17, the first pixel electrode PE-1 and the second pixel electrode PE-2 are arranged between the first signal line Sl-1 and the second signal line Sl-2 in the first direction PX. In FIG. 17, in one pixel column, one first signal line SL-1 is arranged on the left side of the pixel electrode PE, and one second signal line SL-2 is arranged on the right side of the pixel electrode PE. In other words, two of the signal lines SL are collectively arranged between two pixel columns (pixel electrodes PE) adjacent to each other in the first direction PX, and each extend in the second direction PY. Of the two signal lines SL collectively arranged, the first signal line SL-1 on the right side is coupled to a pixel column on the right side thereof, and the second signal line SL-2 on the left side is coupled to a pixel column on the left side thereof.

The first switching element Tr-1 is provided at an intersecting portion between the first scan line GL in the first row and the first signal line SL-1. The drain electrode DE of the first switching element Tr-1 is electrically coupled to the first pixel electrode PE-1 through the contact hole CH1.

The second switching element Tr-2 is provided at an intersecting portion between the scan line GL in the second row and the second signal line SL-2. The drain electrode DE of the second switching element Tr-2 is electrically coupled to the second pixel electrode PE-2 through the contact hole CH1.

The first switching element Tr-1 is located on the left side of the first pixel electrode PE-1, and the second switching element Tr-2 is located on the right side of the second pixel electrode PE-2. That is, the second switching element Tr-2 is located opposite the first switching element Tr-1 in the first direction PX.

The display device 1B of the present embodiment further includes auxiliary signal lines SLs and auxiliary scan lines GLs. The auxiliary signal lines SLs extend in the second direction PY along the signal lines SL and are provided in positions overlapping the signal lines SLs. In more detail, auxiliary signal lines SLs-1 and SLs-2 are arranged in the first direction PX and are provided in positions overlapping the first and the second signal lines SL-1 and SL-2, respectively. The auxiliary signal lines SLs are not provided at a portion where the scan line GL intersects the signal lines SL in plan view.

One end in the second direction PY of each of the auxiliary signal lines SLs is electrically coupled to the signal line SL through a contact hole CH11, and the other end in the second direction PY thereof is electrically coupled to the signal line SL through a contact hole CH12. With this configuration, the wiring resistance provided by the signal lines SL and the auxiliary signal lines SLs is made lower than that of only the signal lines SL. As a result, the gradation signals supplied to the signal lines SL are restrained from being delayed.

Each of the auxiliary scan lines GLs extends in the first direction PX along the scan line GL and is provided in a position overlapping the scan line GL. The auxiliary scan line GLs is not provided at the portion where the scan line GL intersects the signal lines SL in plan view.

One end in the first direction PX of the auxiliary scan line GLs is electrically coupled to the scan line GL through a contact hole CH13, and the other end in the first direction PX thereof is electrically coupled to the scan line GL through a contact hole CH14. With this configuration, the wiring resistance provided by the scan line GL and the auxiliary scan line GLs is made lower than that of only the scan line GL. As a result, the gate drive signal supplied to the scan line GL is restrained from being delayed.

Figure 18:
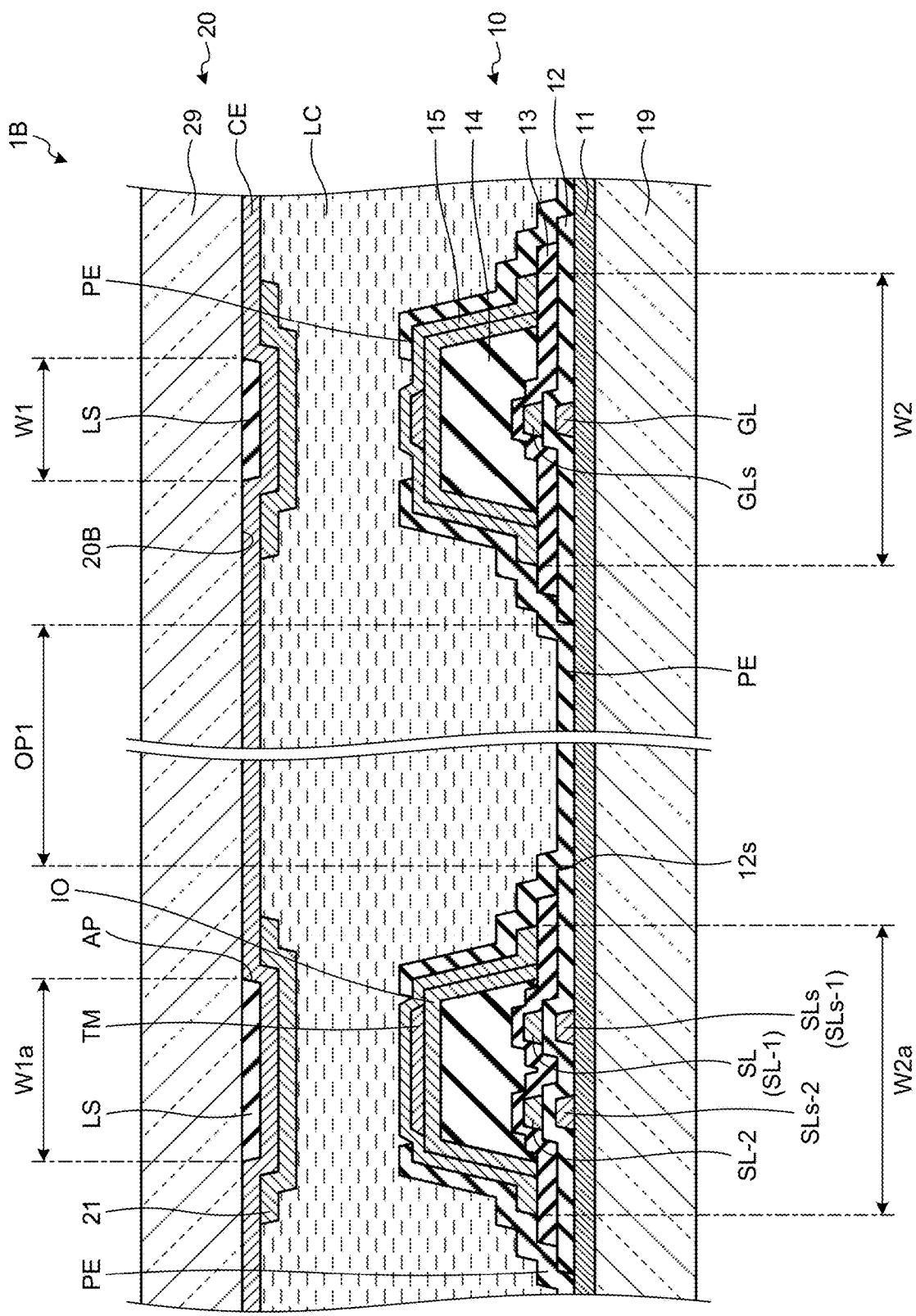
FIG. 18 is a sectional view along XVIII-XVIII' of FIG. 17.

FIG. 18 is a sectional view along XVIII-XVIII' of FIG. 17. The multilayered configuration of the insulating films, the openings, the holding capacitance electrode IO, the metal layer TM, and the pixel electrode PE illustrated in FIG. 18 is the same as that of the first embodiment described above (refer to FIG. 12), and will not be repeatedly described.

As illustrated on the left side of FIG. 18, the auxiliary signal lines SLs-1 and SLs-2 are provided on the undercoat film 11. The auxiliary signal lines SLs are provided in the same layer and formed of the same material as the scan line GL. The gate insulating film 12 is provided above the undercoat film 11 so as to cover the auxiliary signal lines SLs-1 and SLs-2. The first and the second signal lines SL-1 and SL-2 are provided on the gate insulating film 12. The interlayer insulating film 13 is provided on the gate insulating film 12 so as to cover the first and the second signal lines SL-1 and SL-2. The organic insulating film 14, the holding capacitance electrode IO, the metal layer TM, and the capacitance insulating film 15 are provided in an area overlapping the first signal line SL-1, the second signal line SL-2, and the auxiliary signal lines SLs-1 and SLs-2.

As illustrated on the right side of FIG. 18, the scan line GL is provided on the undercoat film 11. The gate insulating film 12 is provided on the undercoat film 11 so as to cover the scan line GL. The auxiliary scan line GLs is provided on the gate insulating film 12. The auxiliary scan line GLs is provided in the same layer and formed of the same material as the signal line SL. The interlayer insulating film 13 is provided on the gate insulating film 12 so as to cover the auxiliary scan line GLs. The organic insulating film 14, the holding capacitance electrode IO, the metal layer TM, and the capacitance insulating film 15 are provided in an area overlapping the scan line GL and the auxiliary scan line GLs.

A width W1a of the light-blocking layer LS in an area overlapping the first and the second signal lines SL-1 and SL-2 is larger than the width W1 of the light-blocking layer LS in an area overlapping the scan line GL. The width W1a of the light-blocking layer LS in the area overlapping the first and the second signal lines SL-1 and SL-2 is smaller than a width W2a of the capacitance insulating film 15. The width W1a of the light-blocking layer LS in the area overlapping the first and the second signal lines SL-1 and SL-2 is smaller than the width of the gate insulating film 12 and the width of the interlayer insulating film 13.

The configuration of the auxiliary signal lines SLs and the auxiliary scan line GLs can be changed as appropriate. Either the auxiliary signal lines SLs or the auxiliary scan line GLs may be omitted. The auxiliary signal lines SLs and the auxiliary scan line GLs illustrated in the second embodiment may be applied to the first embodiment and the first modification described above.

Second Modification of Second Embodiment

Figure 19:
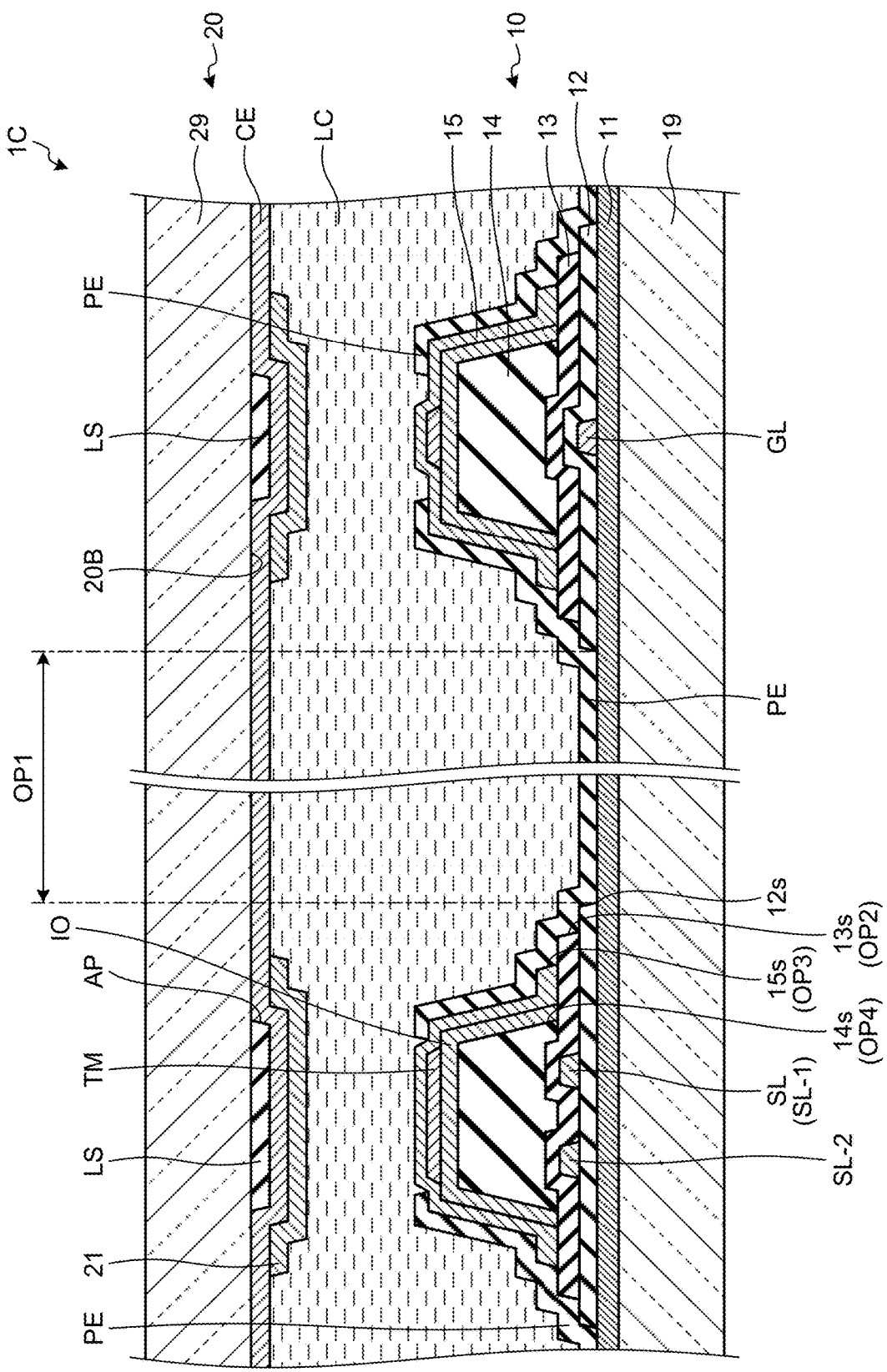
FIG. 19 is a sectional view schematically illustrating a display device according to a second modification of the second embodiment.

FIG. 19 is a sectional view schematically illustrating a display device according to a second modification of the second embodiment. As illustrated in FIG. 19, the configuration of a display device 1C according to a second modification of the second embodiment differs from that in the second embodiment described above in that the auxiliary signal lines SLs-1 and SLs-2 and the auxiliary scan line GLs are not provided. That is, the first and the second signal lines SL-1 and SL-2 are each configured as single-layer wiring. The scan line GL is also configured as single-layer wiring.

The configuration of each of the second embodiment and the second modification can be combined with that of the first modification described above. That is, the undercoat film 11 may be omitted in FIGS. 18 and 19.

Third Embodiment

Figure 20:
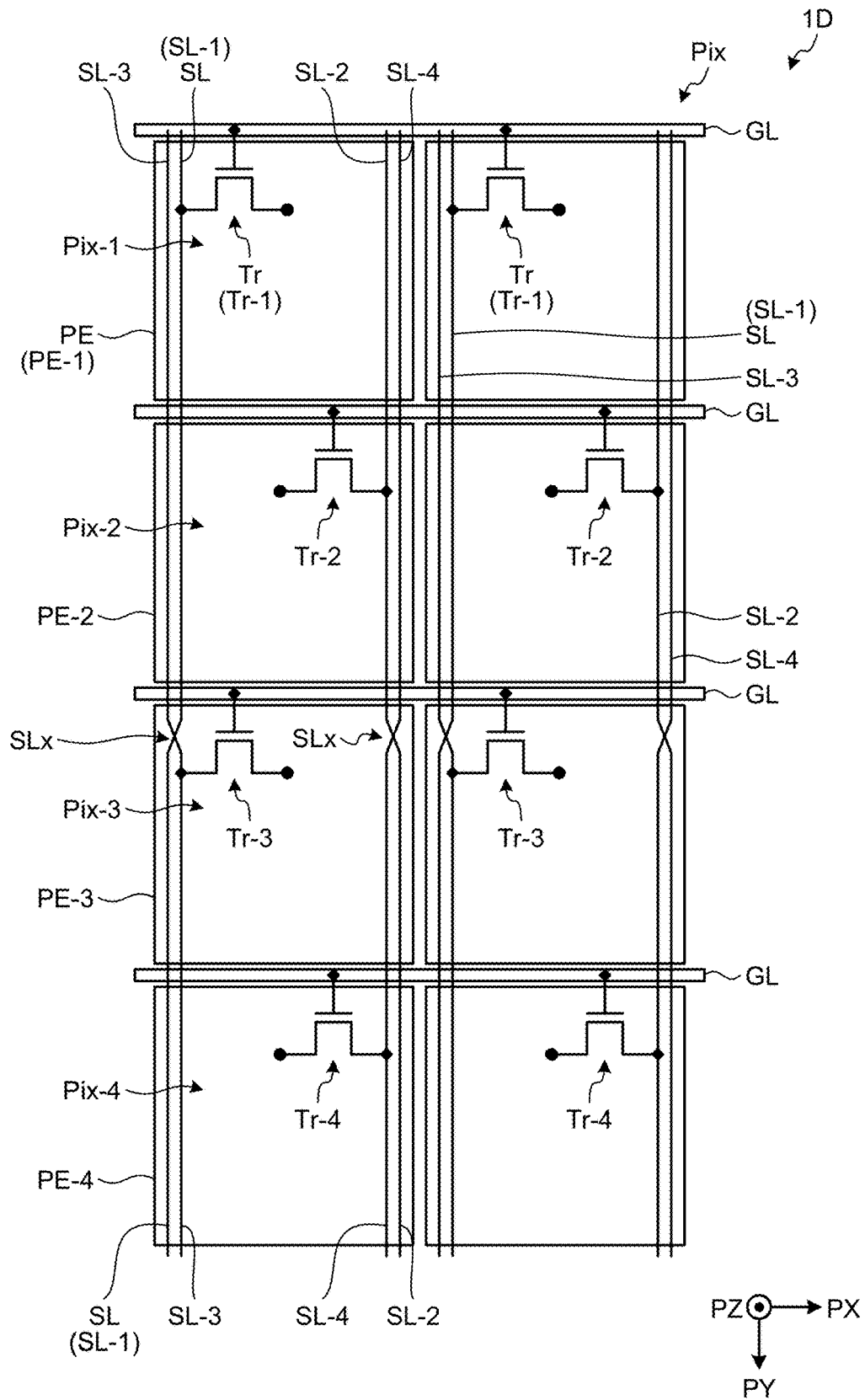
FIG. 20 is a circuit diagram illustrating the pixel array of a display device according to a third embodiment.

FIG. 20 is a circuit diagram illustrating the pixel array of a display device according to a third embodiment. As illustrated in FIG. 20, in a display device 1D according to the third embodiment, four of the signal lines SL is provided for one pixel column. The scan line GL is provided for each pixel row.

The following describes a coupling configuration of the pixels Pix to the scan lines GL and the signal lines SL for one pixel column. One pixel column includes the first pixel Pix-1, the second pixel Pix-2, a third pixel Pix-3, and a fourth pixel Pix-4 arranged in the second direction PY. The first pixel Pix-1 includes the first pixel electrode PE-1 and the first switching element Tr-1. The second pixel Pix-2 includes the second pixel electrode PE-2 and the second switching element Tr-2. The third pixel Pix-3 includes a third pixel electrode PE-3 and a third switching element Tr-3. The fourth pixel Pix-4 includes a fourth pixel electrode PE-4 and a fourth switching element Tr-4.

The first pixel electrode PE-1, the second pixel electrode PE-2, the third pixel electrode PE-3, and the fourth pixel electrode PE-4 are arranged in this order in the second direction PY. The first switching element Tr-1 is electrically coupled to the first pixel electrode PE-1. The second switching element Tr-2 is electrically coupled to the second pixel electrode PE-2. The third switching element Tr-3 is electrically coupled to the third pixel electrode PE-3. The fourth switching element Tr-4 is electrically coupled to the fourth pixel electrode PE-4.

Four of the signal lines SL are provided for one pixel column. The first signal line SL-1 and a third signal line SL-3 are provided on the left side of the pixel column (the first pixel Pix-1, the second pixel Pix-2, the third pixel Pix-3, and the fourth pixel Pix-4), and each extend in the second direction PY. The second signal line SL-2 and a fourth signal line SL-4 are provided on the right side of the pixel column (the first pixel Pix-1, the second pixel Pix-2, the third pixel Pix-3, and the fourth pixel Pix-4), and each extend in the second direction PY.

The first signal line SL-1 is electrically coupled to the first pixel electrode PE-1 through the first switching element Tr-1. The second signal line SL-2 is electrically coupled to the second pixel electrode PE-2 through the second switching element Tr-2. The third signal line SL-3 is electrically coupled to the third pixel electrode PE-3 through the third switching element Tr-3. The fourth signal line SL-4 is electrically coupled to the fourth pixel electrode PE-4 through the fourth switching element Tr-4.

The order of the first signal line SL-1 and the third signal line SL-3 in the first direction PX is interchanged by an intersection SLx. That is, in positions corresponding to the first and the second pixels Pix-1 and Pix-2, the third signal line SL-3 and the first signal line SL-1 are provided to be arranged in this order in the first direction PX. In positions corresponding to the third and the fourth pixels Pix-3 and Pix-4, the first signal line SL-1 and the third signal line SL-3 are provided to be arranged in this order in the first direction PX.

In the same manner, the order of the second signal line SL-2 and the fourth signal line SL-4 in the first direction PX is interchanged by the intersection SLx. That is, in positions corresponding to the first and the second pixels Pix-1 and Pix-2, the second signal line SL-2 and the fourth signal line SL-4 are provided to be arranged in this order in the first direction PX. In positions corresponding to the third and the fourth pixels Pix-3 and Pix-4, the fourth signal line SL-4 and the second signal line SL-2 are provided to be arranged in this order in the first direction PX.

The location of the intersection SLx is not limited to that in FIG. 20. For example, while the same structure as that in FIG. 20 is used where the intersection SLx between the first signal line SL-1 and the third signal line SL-3 is provided immediately before the third switching element Tr-3, the structure may be such that the intersection SLx between the second signal line SL-2 and the fourth signal line SL-4 is also provided immediately before the fourth switching element Tr-4. In this case, unlike in FIG. 20, the intersection SLx between the second signal line SL-2 and the fourth signal line SL-4 and the intersection SLx between the first signal line SL-1 and the third signal line SL-3 are provided not adjacent to each other in the first direction PX, but so as to be shifted from each other by one row.

As a result, even in the configuration where more than one of the signal lines SL are provided for one pixel column, the arrangement relation and the coupling configuration between the switching element Tr and the corresponding signal line SL can be the same among the pixels Pix. For example, the first switching element Tr-1 coupled to the scan line GL in the first row has the same arrangement relation and the same coupling configuration as those of the third switching element Tr-3 coupled to the scan line GL in the third row. The second switching element Tr-2 coupled to the scan line GL in the second row has the same arrangement relation and the same coupling configuration as those of the fourth switching element Tr-4 coupled to the scan line GL in the fourth row.

In the present embodiment, the gate drive circuit 43 (refer to FIG. 2) supplies the gate drive signal simultaneously to the scan lines GL in four pixel rows. This operation simultaneously selects the four pixel rows.

The source drive circuit 44 (refer to FIG. 2) supplies the gradation signal to each of the first, the second, the third, and the fourth signal lines SL-1, SL-2, SL-3, and SL-4. This operation simultaneously writes the gradation signal to each of the pixels Pix in the four selected pixel rows. The source drive circuit 44 (refer to FIG. 2) sequentially supplies the gradation signal to each pixel column, that is, to each set of the four signal lines SL (the first, the second, the third, and the fourth signal lines SL-1, SL-2, SL-3, and SL-4) during the period when the gate drive signal is on.

With the above-described configuration, in the third embodiment, the period for writing the gradation signals to the pixels Pix can be made longer approximately four times that in the case where the pixel row is sequentially selected for each of the scan lines GL and the gradation signal is written for each of the signal lines SL.

Figure 21:
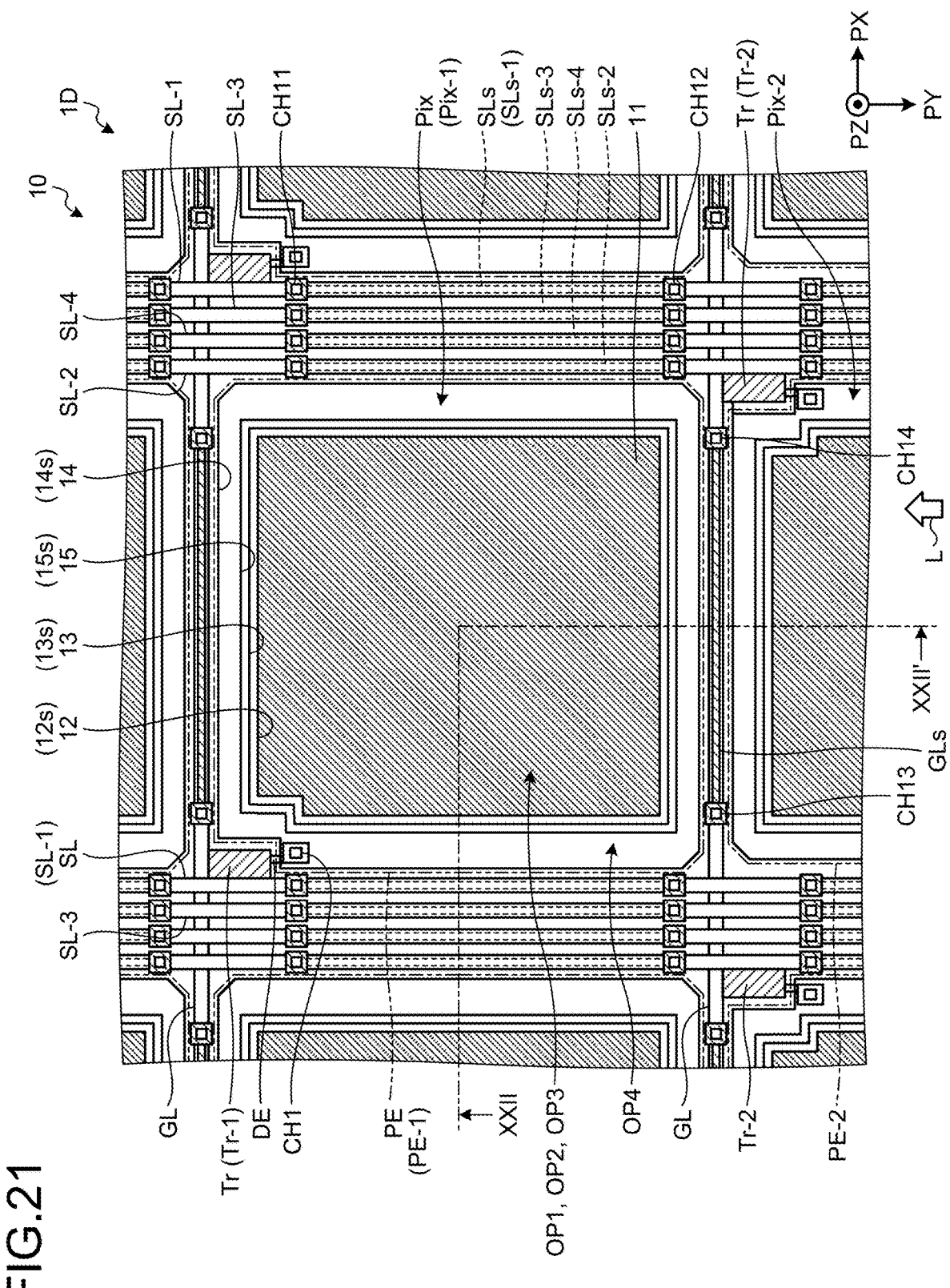
FIG. 21 is a plan view illustrating the scan lines, the signal lines, the switching elements, and the insulating films for the pixels according to a third embodiment.

FIG. 21 is a plan view illustrating the scan lines, the signal lines, the switching elements, and the insulating films for the pixels according to the third embodiment. FIG. 21 illustrates an enlarged view of the first pixel Pix-1 in FIG. 20. As illustrated in FIG. 21, in the first direction PX, the pixel electrode PE is located between the two signal lines SL (the first signal line SL-1 and the third signal line SL-3) and the other two signal lines SL (the second signal line SL-2 and the fourth signal line SL-4) among the first, the second, the third, and the fourth signal lines SL-1, SL-2, SL-3, and SL-4.

In FIG. 21, in one pixel column, two of the signal lines SL (the first signal line SL-1 and the third signal line SL-3) are arranged on the left side of the pixel electrode PE, and two of the signal lines SL (the second signal line SL-2 and the fourth signal line SL-4) are arranged on the right side of the pixel electrode PE. In other words, four of the signal lines SL are arranged collectively between two pixel columns adjacent to each other in the first direction PX, and each extend in the second direction PY. The four signal lines SL are provided between the pixel electrodes PE adjacent in the first direction PX. Of the four signal lines SL arranged collectively, the two on the right side (the first signal line SL-1 and the third signal line SL-3) are coupled to a pixel column on the right side thereof, and the two on the left side (the second signal line SL-2 and the fourth signal line SL-4) are coupled to a pixel column on the left side thereof.

Also in the present embodiment, the display device 1D includes the auxiliary signal lines SLs and the auxiliary scan lines GLs. The auxiliary signal lines SLs-1, SLs-2, SLs-3, and SLs-4 extend in the second direction PY along the first, the second, the third, and the fourth signal lines SL-1, SL-2, SL-3, and SL-4, respectively, and are provided in positions overlapping the signal lines SL. Each of the auxiliary scan lines GLs extends in the first direction PX along the scan line GL and is provided in a position overlapping the scan line GL.

Figure 22:
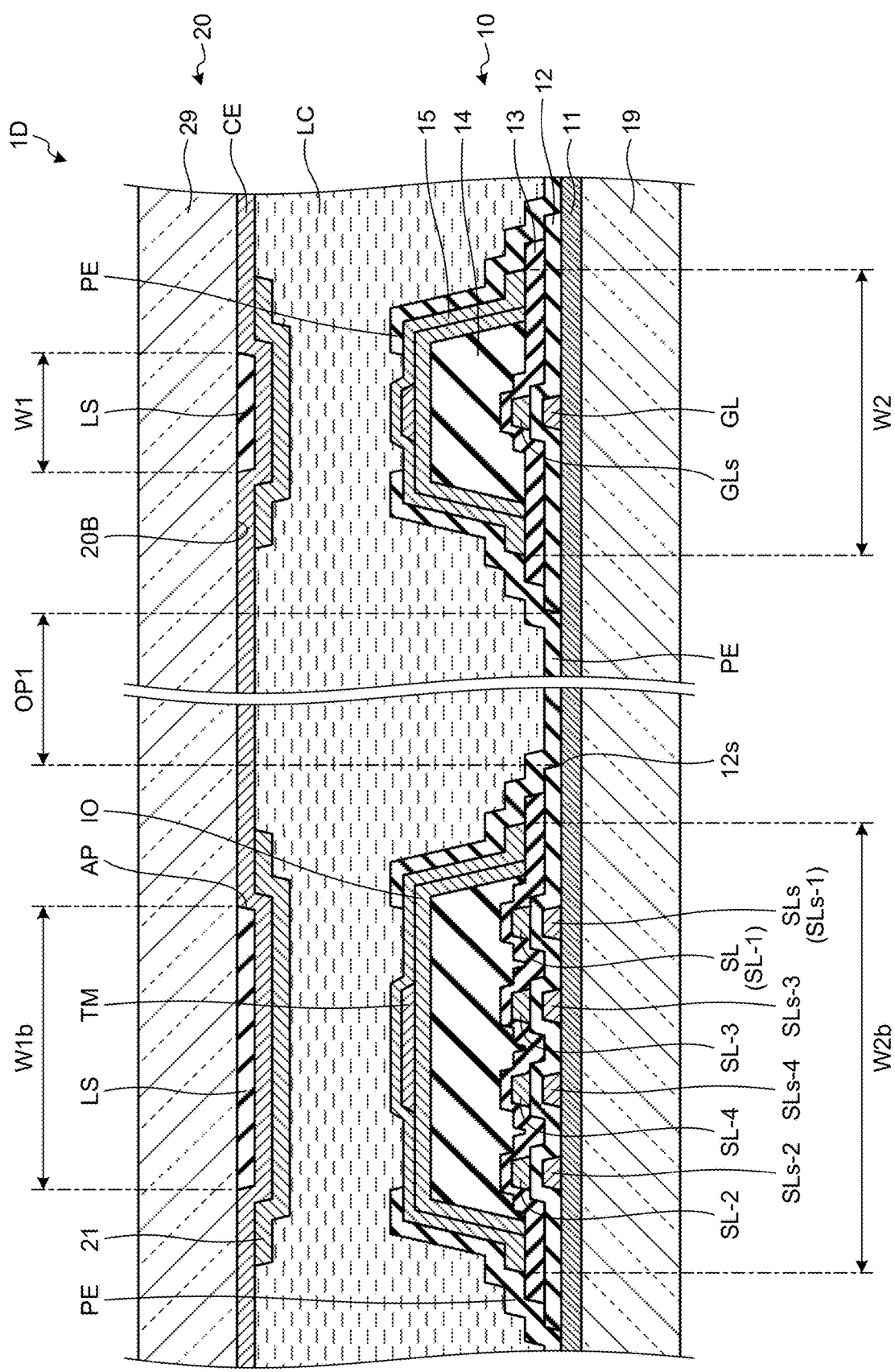
FIG. 22 is a sectional view along XXII-XXII' of FIG. 21.

FIG. 22 is a sectional view along XXII-XXII' of FIG. 21. As illustrated on the left side of FIG. 22, the auxiliary signal lines SLs-1, SLs-2, SLs-3, and SLs-4 are provided above the undercoat film 11. The gate insulating film 12 is provided on the undercoat film 11 so as to cover the auxiliary signal lines SLs-1, SLs-2, SLs-3, and SLs-4. The first, the second, the third, and the fourth signal lines SL-1, SL-2, SL-3, and SL-4 are provided on the gate insulating film 12. The interlayer insulating film 13 is provided on the gate insulating film 12 so as to cover the first, the second, the third, and the fourth signal lines SL-1, SL-2, SL-3, and SL-4. The organic insulating film 14, the holding capacitance electrode IO, the metal layer TM, and the capacitance insulating film 15 are provided in an area overlapping the first, the second, the third, and the fourth signal lines SL-1, SL-2, SL-3, and SL-4 and the auxiliary signal lines SLs-1, SLs-2, SLs-3, and SLs-4.

A width W1$b$ of the light-blocking layer LS in an area overlapping the first, the second, the third, and the fourth signal lines SL-1, SL-2, SL-3, and SL-4 is larger than the width W1 of the light-blocking layer LS in the area overlapping the scan line GL. The width W1$b$ of the light-blocking layer LS in the area overlapping the first, the second, the third, and the fourth signal lines SL-1, SL-2, SL-3, and SL-4 is smaller than a width W2$b$ of the capacitance insulating film 15.

Although not illustrated in any drawing, also in the present embodiment, the auxiliary signal lines SLs-1, SLs-2, SLs-3, and SLs-4 and the auxiliary scan line GLs may be omitted in the same manner as in the second modification of the second embodiment (refer to FIG. 19). That is, the first, the second, the third, and the fourth signal lines SL-1, SL-2, SL-3, and SL-4 may each be configured as single-layer wiring. The scan line GL may also be configured as single-layer wiring.

The configuration of the third embodiment be combined with that of the first modification described above. That is, the undercoat film 11 may be omitted in FIG. 22.

While the preferred embodiments of the present disclosure have been described above, the present disclosure is not limited to such embodiments. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and the modifications described above.

What is claimed is:

1. A display device comprising:
   a first light-transmitting substrate;
   a second light-transmitting substrate that faces the first light-transmitting substrate;
   a liquid crystal layer that is disposed between the first light-transmitting substrate and the second light-transmitting substrate and includes polymer-dispersed liquid crystals;
   a plurality of scan lines that are provided to the first light-transmitting substrate and extend along a first direction;
   a plurality of signal lines that extend in a second direction intersecting the first direction;
   a switching element coupled to a corresponding one of the scan lines and a corresponding one of the signal lines;
   a pixel electrode provided in an area surrounded by scan lines and the signal lines;
   an undercoat film provided so as to cover a principal surface of the first light-transmitting substrate;
   a gate insulating film provided between a gate electrode and a semiconductor layer of the switching element;
   an interlayer insulating film provided so as to cover a source electrode and a drain electrode of the switching element;
   a grid-shaped organic insulating film that covers the scan lines and the signal lines, along the scan lines and the signal lines;
   a light-transmitting electrode that covers the organic insulating film and overlaps at least a portion of the pixel electrode in plan view; and
   a capacitance insulating film provided between the light-transmitting electrode and the pixel electrode, wherein
   the gate insulating film has a first opening in an area overlapping the pixel electrode, and
   the pixel electrode is directly stacked on the undercoat film in the area overlapping the first opening of the gate insulating film, the interlayer insulating film has a second opening in an area overlapping the first opening of the gate insulating film and the pixel electrode, and the capacitance insulating film has a third opening in an area overlapping the first opening of the gate insulating film, the second opening of the interlayer insulating film, and the pixel electrode.

2. The display device according to claim 1, wherein, in plan view, a side surface of the first opening of the gate insulating film is located inside a side surface of the second opening of the interlayer insulating film, and the side surface of the second opening of the interlayer insulating film is located inside a side surface of the third opening of the capacitance insulating film.

3. The display device according to claim 1, comprising a grid-shaped light-blocking layer that is provided to a surface of the second light-transmitting substrate facing the first light-transmitting substrate and covers the scan lines and the signal lines along the scan lines and the signal lines in plan view, wherein a width in the second direction of a portion of the light-blocking layer that covers the scan lines is smaller than a width in the second direction of the gate insulating film.

4. The display device according to claim 1, wherein two of the signal lines are arranged between two of the pixels adjacent in the first direction, and the two signal lines are provided on the upper side of the gate insulating film.

5. A display device comprising:

a first light-transmitting substrate;

a second light-transmitting substrate that faces the first light-transmitting substrate;

a liquid crystal layer that is disposed between the first light-transmitting substrate and the second light-transmitting substrate and includes polymer-dispersed liquid crystals;

a plurality of scan lines that are provided to the first light-transmitting substrate and extend along a first direction;

a plurality of signal lines that extend in a second direction intersecting the first direction;

a switching element coupled to a corresponding one of the scan lines and a corresponding one of the signal lines;

a pixel electrode provided in an area surrounded by scan lines and the signal lines;

a gate insulating film provided between a gate electrode and a semiconductor layer of the switching element;

an interlayer insulating film provided so as to cover a source electrode and a drain electrode of the switching element;

a grid-shaped organic insulating film that covers the scan lines and the signal lines, along the scan lines and the signal lines;

a light-transmitting electrode that covers the organic insulating film and overlaps at least a portion of the pixel electrode in plan view; and a capacitance insulating film provided between the light-transmitting electrode and the pixel electrode, wherein the gate insulating film has a first opening in an area overlapping the pixel electrode, the pixel electrode is directly stacked on a principal surface of the first light-transmitting substrate in the area overlapping the first opening of the gate insulating film, the interlayer insulating film has a second opening in an area overlapping the first opening of the gate insulating film and the pixel electrode, and the capacitance insulating film has a third opening in an area overlapping the first opening of the gate insulating film, the second opening of the interlayer insulating film, and the pixel electrode.

6. The display device according to claim 5, wherein, in plan view, a side surface of the first opening of the gate insulating film is located inside a side surface of the second opening of the interlayer insulating film, and the side surface of the second opening of the interlayer insulating film is located inside a side surface of the third opening of the capacitance insulating film.

7. The display device according to claim 5, comprising a grid-shaped light-blocking layer that is provided to a surface of the second light-transmitting substrate facing the first light-transmitting substrate and covers the scan lines and the signal lines along the scan lines and the signal lines in plan view, wherein a width in the second direction of a portion of the light-blocking layer that covers the scan lines is smaller than a width in the second direction of the gate insulating film.

8. The display device according to claim 5, wherein two of the signal lines are arranged between two of the pixels adjacent in the first direction, and the two signal lines are provided on the upper side of the gate insulating film.

* * * * *